(12) United States Patent
Shau

(10) Patent No.: US 9,632,571 B1
(45) Date of Patent: Apr. 25, 2017

(54) LOW POWER HIGH PERFORMANCE ELECTRICAL CIRCUITS

(71) Applicant: Jeng-Jye Shau, Palo Alto, CA (US)

(72) Inventor: Jeng-Jye Shau, Palo Alto, CA (US)

(*) Notice: Subject to any disclaimer, the term of this patent is extended or adjusted under 35 U.S.C. 154(b) by 0 days.

(21) Appl. No.: 15/236,327

(22) Filed: Aug. 12, 2016

Related U.S. Application Data

(63) Continuation-in-part of application No. 15/201,465, filed on Jul. 3, 2016, which is a continuation-in-part of application No. 15/094,960, filed on Apr. 8, 2016, now Pat. No. 9,552,871.

(51) Int. Cl.
| | |
|---|---|
| *G11C 8/08* | (2006.01) |
| *G06F 1/32* | (2006.01) |
| *G06F 17/50* | (2006.01) |
| *G11C 11/419* | (2006.01) |
| *G11C 11/413* | (2006.01) |
| G11C 11/408 | (2006.01) |
| G11C 11/4063 | (2006.01) |
| G11C 8/10 | (2006.01) |

(52) U.S. Cl.
CPC ........ *G06F 1/3296* (2013.01); *G06F 17/5072* (2013.01); *G11C 11/413* (2013.01); *G11C 11/419* (2013.01); *G11C 8/08* (2013.01); *G11C 8/10* (2013.01); *G11C 11/4063* (2013.01); *G11C 11/4085* (2013.01)

(58) Field of Classification Search
CPC ........... G11C 8/08; G11C 8/10; G11C 11/413; G11C 11/419; G11C 11/4063; G11C 11/4085; G06F 1/3296; G06F 17/5072
USPC ...... 365/156, 154, 185.23, 226, 227, 230.06
See application file for complete search history.

(56) References Cited

U.S. PATENT DOCUMENTS

| | | | | | |
|---|---|---|---|---|---|
| 5,351,217 | A | * | 9/1994 | Jeon ......................... | G11C 8/08 326/106 |
| 5,914,905 | A | * | 6/1999 | Hikichi .................... | G11C 8/10 365/229 |
| 7,646,653 | B2 | * | 1/2010 | Choi .................... | G11C 11/4074 365/189.09 |
| 7,782,655 | B2 | | 8/2010 | Shau | |
| 8,164,969 | B2 | | 4/2012 | Shau | |
| 2007/0242555 | A1 | * | 10/2007 | Lee ......................... | G11C 8/08 365/230.06 |
| 2008/0080296 | A1 | * | 4/2008 | Lee ......................... | G11C 8/08 365/230.06 |

* cited by examiner

*Primary Examiner* — Tan T. Nguyen

(57) ABSTRACT

A power saving mode especially useful for memory decoders has been developed. At this power saving mode, the drain-to-source voltage of every MOS transistor in a memory decoder is set to zero, while at normal operation the memory decoder supports the same functions as prior art memory decoders.

20 Claims, 14 Drawing Sheets

FIG. 1(a): Prior Art PMU
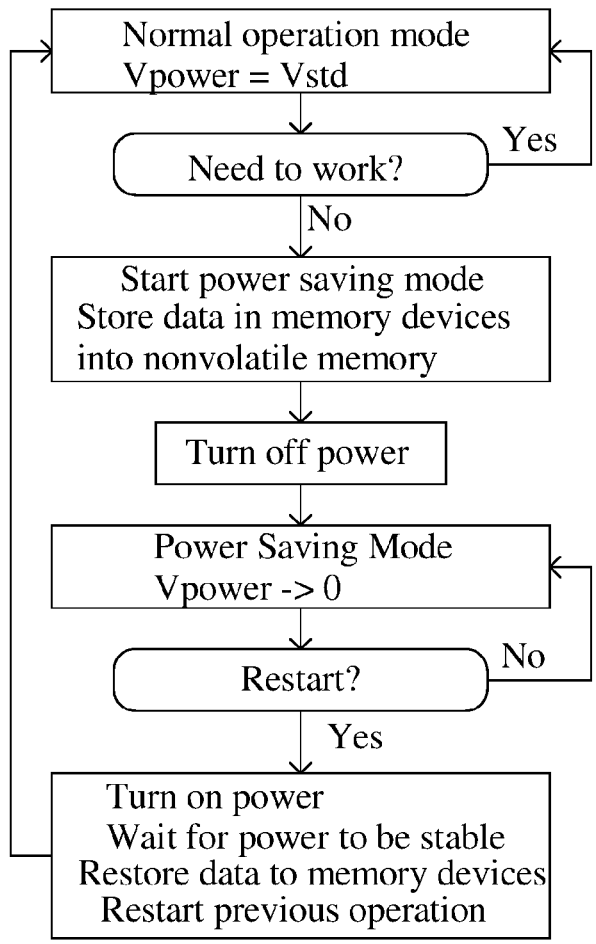
FIG. 1(b) Prior Art Hybrid SubVt Mode
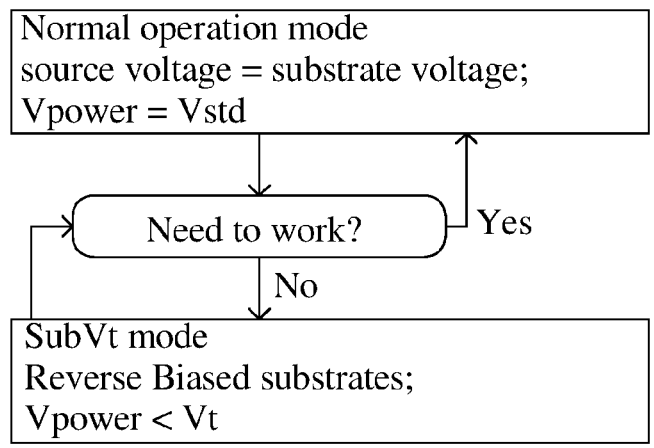

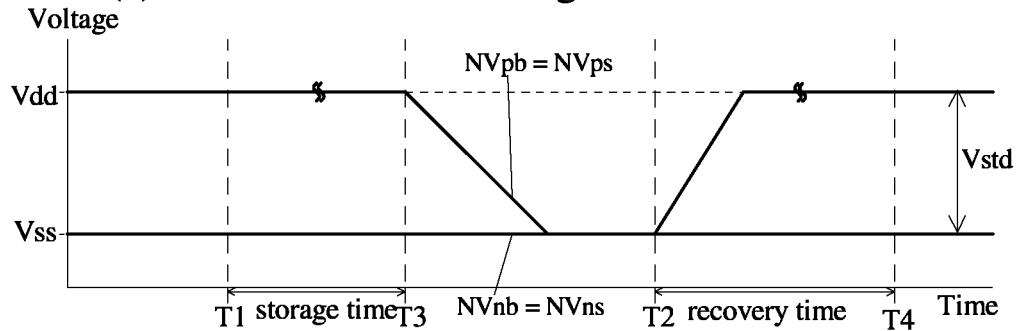
FIG. 2(a) Prior Art Power Saving Mode
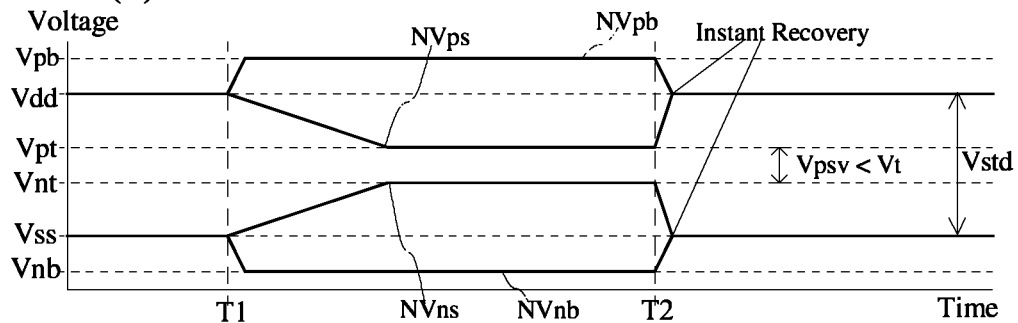
FIG. 2(b) SubVt Mode
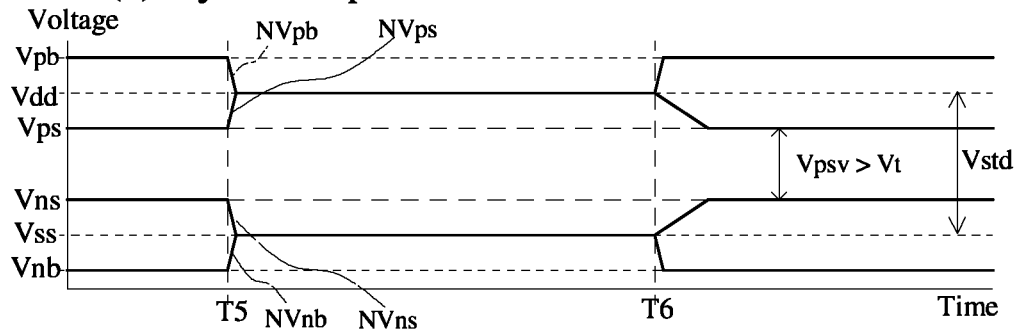
FIG. 2(c) Hybrid SupVt Mode
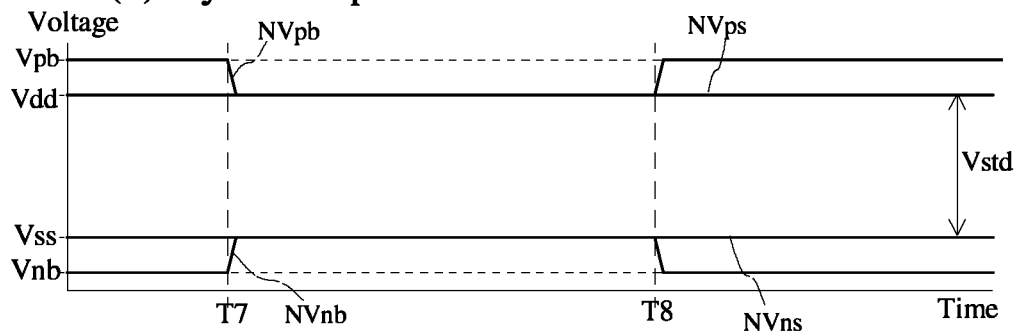
FIG. 2(d) Hybrid SupVt Mode

FIG. 8(a) Prior Art Planar MOS transistor
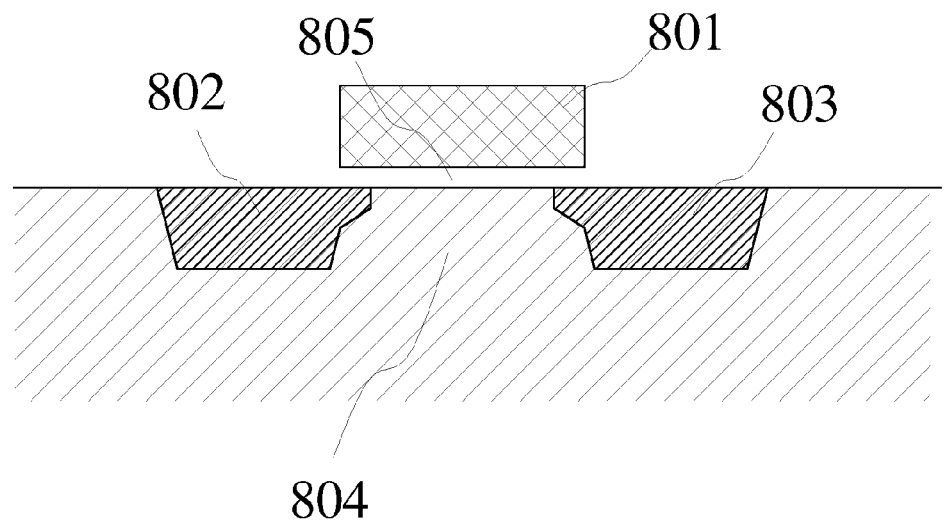
FIG. 8(b) Prior Art FinFET
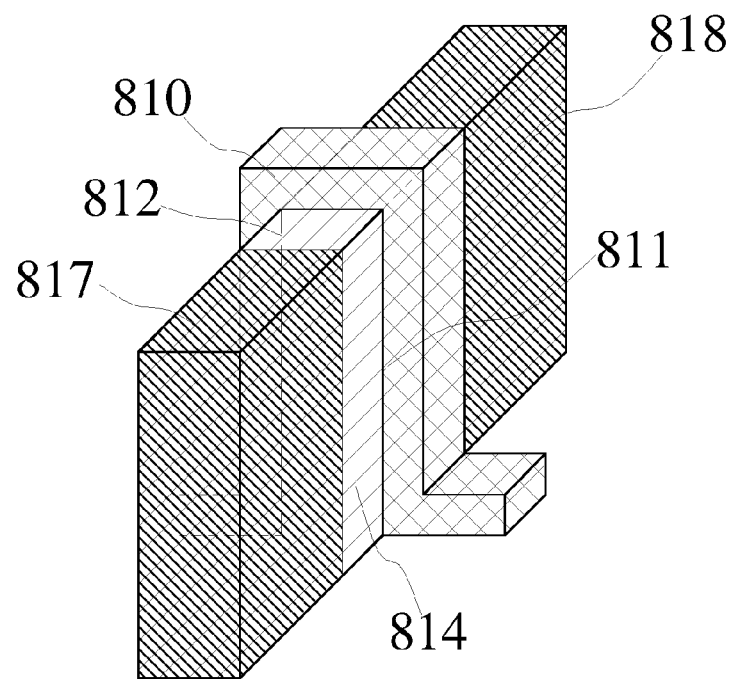

FIG. 8(c) Prior Art FinFET
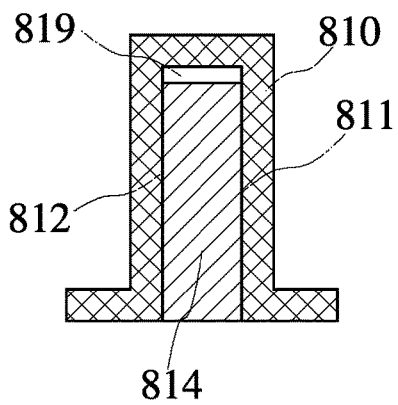
FIG. 8(d) Prior Art TriFET
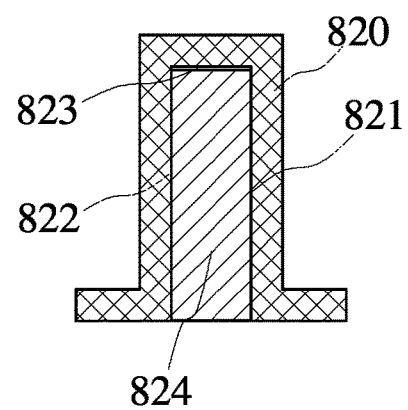
FIG. 8(e) Prior Art TriFET
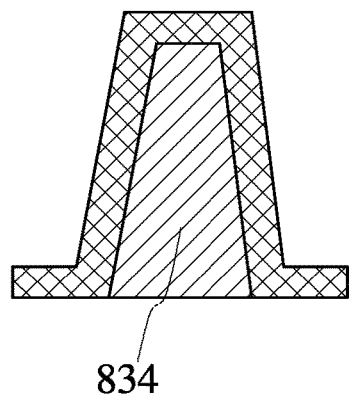
FIG. 8(f) Prior Art Omega
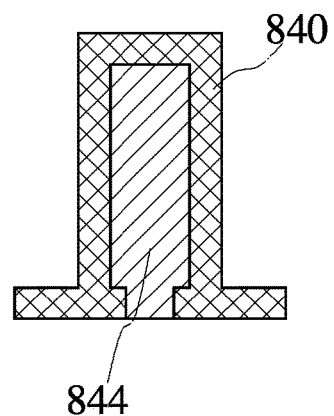
FIG. 8(g) Prior Art GAA
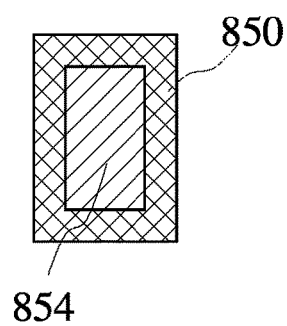

LOW POWER HIGH PERFORMANCE ELECTRICAL CIRCUITS

This application is a continuation-in-part application of previous patent application with a Ser. No. 15/210,465, with a title "Low Power High Performance Electrical Circuits", and filed by the applicant of this invention on Jul. 3, 2016. The patent application Ser. No. 15/210,465 is a continuation-in-part application of previous patent application with a Ser. No. 15/094,960, with a title "Low Power High Performance Electrical Circuits", and filed by the applicant of this invention on Apr. 8, 2016.

BACKGROUND OF THE INVENTION

The present invention relates to low power electrical circuits, and more particularly to low power memory decoders.

Complementary Metal-Oxide-Semiconductor (CMOS) is a technology for constructing Integrated Circuits (ICs). CMOS technologies are used in microprocessors, microcontrollers, Static Random Access Memory (SRAM), Application Specific Integrated Circuits (ASIC), and wide varieties of electrical circuits. The word "complementary" refer to the fact that the typical design style with CMOS uses complementary pairs of p-channel and n-channel metal-oxide-semiconductor Field Effect Transistors (FETs). Since one transistor of the pair is always off, the series combination draws significant power only momentarily during switching between on and off states. Consequently, CMOS devices do not waste as much power as other forms of logic, such as Transistor-Transistor Logic (TTL) or N-channel Metal-Oxide-Semiconductor (NMOS) logic, that normally have significant standby leakage current even when not changing state. By definition, "standby leakage current" is the current flowing through the power supply of a circuit when the circuit is not changing state. The standby leakage currents of CMOS circuits are typically much lower than that of other types of circuits. It was primarily for this reason that CMOS became the most used technology to be implemented in integrated circuits.

As IC technologies advanced, the channel lengths of MOS transistors have been reduced. Currently, transistors with channel length as short as 5 nanometers (nm) have been manufactured. The standby leakage currents of CMOS circuits increase rapidly with decreasing channel lengths of CMOS transistors. For CMOS circuits using transistors with channel lengths longer than 200 nm, the standby leakage currents of the CMOS circuits are typically negligible. On the other hand, short channel CMOS circuits can waste significant power even when the circuit is not changing state. Consequently, it is often necessary to provide power saving methods to reduce standby leakage currents for short channel CMOS circuits.

Currently, most of power saving methods are controlled by logic circuits called power management units. A prior art Power Management Unit (PMU) monitors the activities of circuit blocks, and turns off the power supply of a circuit block that is not in use in order to save power. FIG. 1($a$) is a flowchart showing typical operations of a prior art PMU, and FIG. 2($a$) is a timing diagram showing the power supply voltages of a circuit block controlled by a prior art PMU. At normal operation conditions, the substrate terminals and the source terminals of the p-channel transistor that are connected to the power source are connected to a power line at voltage Vdd, and the n-channel substrate terminals and the source terminals of n-channel transistors that are connected to power source are connected to a ground line at voltage Vss; the power supply voltage (Vpower) is equal to (Vdd−Vss) and it is typically set at a standard voltage (Vstd). Each generation of CMOS technology is optimized for a particular standard voltage. For examples, the standard voltage for 180 nm technology is typically 1.8 volts, Vstd is typically 1.2 volts for 130 nm technology, Vstd is typically 1.0 volt for 90 nm technologies, and so on. The prior art PMU monitors the activities of the whole circuit to determine whether a particular circuit block needs to work or not. If the circuit block needs to work, it stays in full power, which means that Vpower applied on the circuit block stays at Vstd. If a circuit block is no longer needed to work, the PMU can shut down the circuit block to save power. For example, the PMU found that starting from time T1 in FIG. 2($a$), a circuit block is no longer needed. Typically, a prior art PMU cannot turn off the power immediately at time T1. When the power supply of a circuit block is turned off, the data stored in the volatile memory devices inside the circuit block can be lost. When the power is turned back on, the circuit may not return to previous state because the contents in memory devices can be different after power up. Examples of volatile memory devices include Static Random Access Memory (SRAM), Content Addressable Memory (CAM), registers, latches, flip-flops, and so on. It is typically necessary to store the contents of volatile memory devices before shutting down the power. As shown in FIG. 1($a$), when the PMU determines to shut down a circuit block to save power, it typically needs to store data in memory devices into nonvolatile memory before turning off the power of the circuit block to save power. As shown in FIG. 2($a$), the circuit block is not in use since time T1, but the PMU need to maintain in full power on the circuit block until time T3. The storage time (T3-T1) is used to store contents in memory devices into nonvolatile memory devices such as hard discs. This procedure can be time consuming, and it can burn a lot of power. After time T3, the PMU can shut down the power, and Vpower gradually approaches zero, as shown in FIG. 2($a$). During this period of time, the PMU continues to monitor the activities of the whole circuit to determine whether the circuit in power saving mode is needed or not. If the circuit block is not needed, it can stay in power saving mode, as shown in FIG. 1($a$). If the circuit block is needed, the PMU restarts the circuit block by turning on its power at time T2, as shown in FIG. 2($a$). However, the circuit block is not ready to function until the data are restored back to the memory devices in the circuit block at time T4, as shown in FIG. 2($a$). This recovery time (T4-T2) can be long, and the circuit block can consume a lot of power during recovery. After time T4, the circuit block is ready to restart normal operations, as illustrated in FIG. 2($a$).

The operation of prior art PMUs can be very complex, especially when a circuit block comprises many memory devices. The procedures to shut down and restore a circuit block can be time consuming, and the processes can consume a lot of power. The PMU itself also can consume significant power. It is therefore highly desirable to develop power saving modes that support fast recovery time.

In U.S. Pat. No. 7,782,655 and in U.S. Pat. No. 8,164,969, Shau disclosed "Hybrid Subthreshold (SubVt) Circuits" that solved many problems of prior art power management units. FIG. 1($b$) is a flowchart showing typical operations of a prior art Hybrid SubVt circuit. FIG. 2($b$) is a timing diagram showing the voltages applied on a circuit block controlled by a prior art Hybrid SubVt controller, where NVps is the power connection to the source terminals of p-channel MOS transistors that are connected to power source, NVpb is the electrical connection to the substrate terminals of p-channel MOS transistors, NVns is the ground connection to the source terminals of n-channel MOS transistors that are connected to power source, and NVnb is the electrical connection to the substrate terminals of n-channel MOS transistors. At normal operation, Hybrid SubVt circuits operates in the same condition as typical CMOS circuits, where NVpb is connected to NVps at power supply voltage Vdd, NVnb is connected to NVns at ground voltage Vss, and the power supply voltage (Vpower) equals standard voltage (Vstd), as shown in the timing diagram in FIG. 2(b). A Hybrid SubVt controller monitors the activities of the whole circuit to determine whether a particular circuit block needs to work or not. If the circuit block needs to work, then it stays in full power, which means that Vpower of the circuit block stays at Vstd. If a circuit block is no longer needed to work, the circuit can be placed into subthreshold power saving mode, as shown in FIG. 1(b). At subthreshold power saving mode, the power supply voltage (Vpower) is reduced to a level that is lower than the threshold voltages (Vt) of the MOS transistors in the circuit block. Under SubVt mode, the standby leakage current of the circuit can be reduced by 99% or more relative to the standby leakage current of the same electrical circuit under normal operation mode, while all the memory devices still can hold their data. It is therefore possible to get into SubVt power saving mode immediately without the need to store the data in memory devices into nonvolatile memory devices. For example, the controller found that starting from time T1 in FIG. 2(a) the circuit block is no longer needed. Right after T1, the circuit can get into SubVt power saving mode, where NVpb is pulled up to a voltage Vpb that is higher than Vdd, NVnb is pulled down to a voltage Vns that is lower than Vss, the voltage on NVps is allowed to drop no lower than a voltage Vpt, and the voltage on Vns is allowed to rise no higher than a voltage Vnt, as shown in FIG. 2(b). The voltage difference (Vpt–Vnt) is controlled to be lower than Vt, so that the circuit block is under SubVt mode. During this period of time, the controller continues to monitor the activities of the whole circuit to determine whether the circuit in power saving mode is needed or not. If the circuit block is not needed, it can stay in SubVt mode, as shown in FIG. 1(b). If the circuit block is needed, the controller restarts the circuit block by going back to normal operation mode at time T2, as shown in FIG. 2(b). Since there is no need to restore data from nonvolatile memory devices, the circuit block can go back to normal operation mode instantly after time T2, as shown in FIG. 2(b).

Shau's hybrid SubVt circuits significantly reduced the wastes in power during storage time and recovery time. However, hybrid SubVt mode is applicable typically when the circuit block does not need to do any work. It is highly desirable to develop a power saving mode that is applicable on circuit blocks that need to do work.

MOS transistors with channel length longer than 25 nm are typically planar transistors. FIG. 8(a) is a simplified cross-section diagram illustrating the structures of a planar MOS transistor. The gate of this planar transistor is formed between a gate insulator (805) and a semiconductor substrate (804) on a planar surface. Ideally, the electrical current between the drain terminal (803) and the source terminal (802) is controlled by the voltage on the gate terminal (801). For short channel transistors, it is well known that drain voltage coupled to the semiconductor substrate can induced leakage in substrate areas that are away from the gate area. One solution to solve this Drain Voltage Induced Leakage (DVIL) problem is to manufacture transistors in a thin semiconductor body that is controlled by gates from multiple sides. A multiple-gate MOS transistor, by definition, is an MOS transistor that comprises gates on multiple sides of a semiconductor substrate. The multiple gates may be controlled by a single gate electrode, wherein the multiple gate surfaces act electrically as a single gate, or by independent gate electrodes. Current art MOS transistors with channel length shorter than 25 nm are typically multiple-gate transistors.

FIG. 8(b) is a simplified diagram illustrating the three dimensional structures of one example of a multiple-gate MOS transistor known as "FinFET". The distinguishing structure of a FinFET is a thin slice of semiconductor "fin" (814) that forms the body of the device. This semiconductor fin (814) is formed above field oxide so that a gate electrode (810) can wraps around three surfaces of the fin (814), as shown in FIGS. 8(b, c). The source (817) and drain (818) terminals of the FinFET are formed by heavily doped diffusion regions on the fin, as shown in FIG. 8(b). FIG. 8(c) is a simplified cross-section diagram illustrating the gate structures of the FinFET in FIG. 8(b). The interfaces between the gate electrode (810) and the semiconductor fin (814) on the two side surfaces (811, 812) of the fin form the gate interfaces of the FinFET. The top surface of the semiconductor body (814) of the transistor is typically separated from the gate electrode (810) by a thick insulator (819) so that the top surface is not active. This Wrap-around gate structure provides a better electrical control over the channel and thus helps in overcoming short-channel effects.

Similar Multiple-gate MOS transistors have been manufactured. FIG. 8(d) is a simplified cross-section diagram illustrating the gate structures of one example of a multiple-gate MOS transistor known as "TriFET". A gate electrode (820) wraps around three surfaces of a thin slice of semiconductor body (824), as shown in FIG. 8(d), while all three interfaces (821-823) between the gate electrode (820) and the semiconductor body (824) form the gates of the TriFET. The cross-section of the semiconductor fin does not have to be a rectangle. FIG. 8(e) is a simplified cross-section diagram illustrating the gate structures of another TriFET that has a semiconductor body (834) that is narrower on top and wider on bottom. FIG. 8(f) is a simplified cross-section diagram illustrating the gate structures of one example of a multiple-gate MOS transistor known as "Omega FET". The "Omega FET" design is named after the similarity between the Greek letter omega (Ω) and the shape in which the gate electrode (840) wraps around its semiconductor body (844), as shown in FIG. 8(f). FIG. 8(g) is a simplified cross-section diagram illustrating the gate structures of one example of a multiple-gate MOS transistor known as "Gate-all-around (GAA) FET". The gate electrode (850) of a GAA FET surrounds a semiconductor body (854) on all sides, as shown in FIG. 8(g). The body (854) of a GAA FET does not have to be rectangle; it can be a circle or other shapes. These and other types of multiple-gate MOS transistors achieve better power efficiency by reducing short channel effects. It is desirable to build hybrid circuits using multiple-gate MOS transistors to achieve further power efficiency. With reference to previous patent application (Ser. No. 15/094,960), this application provides additional considerations on implementations of hybrid circuits using multiple-gate transistors.

The major difference between hybrid circuits that use planar MOS transistors versus hybrid circuits that use multiple-gate MOS transistors is that the latter may or may not have effective substrate connections that can connect to the substrate terminals of many multiple-gate MOS transistors. FIG. 9(a) is a simplified cross-section diagram illustrating substrate connections for multiple-gate MOS transistors. In this example, the semiconductor bodies (NFn0, NFn1) of two n-channel multiple-gate MOS transistors (Mgn0, Mgn1) are connected together through the p-type well (PWell) under those transistors; a semiconductor contact (Cpw) penetrating through field oxide (OXf) provides electrical connection from a metal line (NVpw) to PWell; heavily doped p-type diffusion area (PWdp) is deposited in the PWell to reduce the resistance of this substrate connection, as shown in FIG. 9(a). In this example, PWell is completely surrounded by NWell so that it is isolated from the p-type substrate (Psub) of the bulk semiconductor. However, it is also possible to allow PWell to be connected to Psub. Similarly, the semiconductor bodies (NFp0, NFp1) of two p-channel multiple-gate MOS transistors (Mgp0, Mgp1) are connected together through the n-type well (NWell) under those transistors; a semiconductor contact (Cnw) penetrating through field oxide (OXf) provides electrical connection from metal line (NVnw) to NWell; heavily doped n-type diffusion area (NWdp) is deposited in the NWell to reduce the resistance of this substrate connection, as shown in FIG. 9(a). FIG. 9(d) is a simplified symbolic diagram illustrating the equivalent circuit of the n-channel multiple-gate MOS transistors (Mgn0, Mgn1) in FIG. 9(a). The substrate terminal (NVnb) of the transistor is connected to PWell connection (NVpw) through an electrical path that is represented by a resistor (Rpw) in FIG. 9(d). The substrate terminal (NVnb) is coupled to the source terminal (NVns) through a junction diode (DSn), and it is also coupled to the drain terminal (NVnd) through another junction diode (DDn). The gate terminal (NVng) controls the gate voltage. During switching events, a substrate current (Ibn) may be generated through impact ionization or recombination mechanisms. When the substrate current (Ibn) flow toward NVpw through Rpw, the IR drop may cause a voltage difference between the substrate voltage (Vnb) at NVnb and the well voltage (Vpw) at NVpw. This voltage difference is typically small, so that the PWell connection in FIG. 9(a) is typically an effective electrical substrate connection to the substrate terminals of both n-channel multiple-gate transistors (Mgn0, Mgn1). FIG. 9(e) is a simplified symbolic diagram illustrating the equivalent circuit of the p-channel multiple-gate MOS transistors (Mgp0, Mgp1) in FIG. 9(a). The substrate terminal (NVpb) of the transistor is connected to NWell connection (NVnw) through a conducting path that is represented by a resistor (Rnw) in FIG. 9(e). The substrate terminal (NVpb) is coupled to the source terminal (NVps) through a junction diode (DSp), and it is also coupled to the drain terminal (NVpd) through another junction diode (DDp). The gate terminal (NVpg) controls the gate voltage. During switching events, a substrate current (Ibp) may be generated through impact ionization or recombination mechanism. When the substrate current (Ibp) flow toward NVnw through Rnw, the IR drop may cause a voltage difference between the substrate voltage (Vpb) at NVpb and the well voltage (Vnw) at NVnw. This voltage difference is typically very small, so that the NWell connection in FIG. 9(a) is typically an effective electrical substrate connection to the substrate terminals of both p-channel multiple-gate transistors (Mgp0, Mgp1). For hybrid circuits that comprise multiple-gate MOS transistors with effective substrate connections such as the example shown in FIG. 9(a), they can be controlled in similar ways as planar MOS transistors to support SupVt or SubVt hybrid circuits. The methods, embodiments, and examples disclosed in patent application Ser. No. 15/094,960, U.S. Pat. No. 7,782,655, or U.S. Pat. No. 8,164,969 are all applicable to such cases.

FIG. 9(b) is a simplified cross-section diagram of a circuit that has identical electrical connections to the wells (Pwell, Nwell) as those shown in FIG. 9(a). In this example, the semiconductor bodies (NFn2, NFn3) of n-channel multiple-gate MOS transistors (Mgn2, Mgn3) are isolated from PWell by field oxide (OXf), and the semiconductor bodies (NFp2, NFp3) of p-channel multiple-gate MOS transistors (Mgp2, Mgp3) are also isolated from NWell by field oxide (OXf), as shown in FIG. 9(b). In this example, the well connections (NVpw, NVnw) can only influence the substrates (NFn2, NFn3, NFp2, NFp3) of those multiple-gate transistors (Mgn2, Mgn3, Mgp2, Mgp3) through capacitor coupling of the capacitor formed across filed oxide (OXf). FIG. 9(f) is a simplified symbolic diagram illustrating the equivalent circuit of the n-channel multiple-gate MOS transistors (Mgn2, Mgn3) in FIG. 9(b). This equivalent circuit is identical to the equivalent circuit in FIG. 9(d) except that the substrate terminal (NVnb) is coupled to PWell connection (NVpw) by a capacitor (Coxf) instead of a resistor (Rpw). Since this capacitor (Coxf) is formed across the field oxide (OXf), the capacitor is very small. The influence of the voltage on well connection (NVpw) from substrate terminal (NVnb) is very small. The substrate current (Ibn) mostly flow through the junction diode (DSn) to the source terminal (NVns). Therefore, the substrate voltage (Vnb) on the substrate terminal (NVnb) can be significantly different from the voltage on the well connection (NVpw). FIG. 9(g) is a simplified symbolic diagram illustrating the equivalent circuit of the p-channel multiple-gate MOS transistors (Mgp2, Mgp3) in FIG. 9(b). This equivalent circuit is identical to the equivalent circuit in FIG. 9(e) except that the substrate terminal (NVpb) is coupled to NWell connection (NVnw) by a capacitor (Coxf) instead of a resistor (Rnw). The substrate voltage (Vpb) on the substrate terminal (NVpb) can be significantly different from the voltage on the well connection (NVnw). For the example shown in FIG. 9(b), the well connections (NVpw, NVnw) do not provide effective substrate connections to the multiple-gate transistors (Mgn2, Mgn3, Mgp2, Mgp3). For hybrid circuits that comprise multiple-gate MOS transistors with isolated substrate connections such as the example shown in FIG. 9(b), the substrate voltages of MOS transistors are not necessarily the same as the voltages on wells. The methods, embodiments, and examples disclosed in patent application Ser. No. 15/094,960, U.S. Pat. No. 7,782, 655, or U.S. Pat. No. 8,164,969 are still applicable to such cases except that the substrates terminals of transistors can have different voltages.

FIG. 9(c) is a simplified cross-section diagram of a circuit that has identical electrical connections to the wells (Pwell, Nwell) as those shown in FIG. 9(a). In this example, the semiconductor bodies (NFn4, NFn5) of n-channel gate-all-around MOS transistors (Mgn4, Mgn5) are not only isolated from PWell by field oxide (OXf) but also shielded from well voltage by the gate electrodes. The semiconductor bodies (NFp4, NFp5) of p-channel gate-all-around MOS transistors (Mgp4, Mgp5) are not only isolated from NWell by field oxide (OXf), but also shielded from well voltage by the gate electrodes, as shown in FIG. 9(c). In this example, the well connections (NVpw, NVnw) are completely disconnected from the substrates (NFn4, NFn5, NFp4, NFp5) of those multiple-gate transistors (Mgn4, Mgn5, Mgp4, Mgp5). FIG. 9(h) is a simplified symbolic diagram illustrating the equivalent circuit of the n-channel multiple-gate MOS transistors (Mgn4, Mgn5) in FIG. 9(c). This equivalent circuit is identical to the equivalent circuit in FIG. 9(d) except that the substrate terminal (NVnb) is disconnection from PWell connection (NVpw). The substrate voltage (Vnb) on the substrate terminal (NVnb) is not influenced by the voltage on the well connection. FIG. 9(i) is a simplified symbolic diagram illustrating the equivalent circuit of the p-channel multiple-gate MOS transistors (Mgp4, Mgp5) in FIG. 9(c). This equivalent circuit is identical to the equivalent circuit in FIG. 9(e) except that the substrate terminal (NVpb) is disconnected from NWell connection. The substrate voltage (Vpb) on the substrate terminal (NVpb) is not influenced by the voltage on the well connection (NVnw). For the example shown in FIG. 9(c), the well connections (NVpw, NVnw) do not provide effective substrate connections to the multiple-gate transistors (Mgn4, Mgn5, Mgp4, Mgp5). For hybrid circuits that comprise multiple-gate MOS transistors with isolated substrate connections such as the example shown in FIG. 9(c), the substrate voltages of MOS transistors are not necessarily the same as the voltages on wells. The methods, embodiments, and examples disclosed in patent application Ser. No. 15/094,960, U.S. Pat. No. 7,782,655, or U.S. Pat. No. 8,164,969 are still applicable to such cases except that the substrates terminals of transistors can be isolated.

Multiple-gate MOS transistors may or may not have electrical connections to the wells in the bulk semiconductor substrate, as shown by the examples in FIGS. 9(a-i). All multiple-gate MOS transistors still are 4 terminal devices. Each multiple-gate MOS transistor has a substrate terminal, and the voltage on the substrate terminal can influence operations of the transistor. The substrate terminal of a multiple-gate MOS transistor needs to provide a path for substrate current generated by impact ionization or recombination mechanisms. When a substrate terminal is connected to an effective substrate connection, such as the examples shown in FIGS. 9(a, d, e), the influence of substrate current can be small. When a substrate terminal is floating, such as the examples shown in FIGS. 9(b, c, f-i), the transistor is less stable. The voltage on the substrate terminal of a multiple-gate MOS transistor can influence the channel current of the transistor. FIG. 9(j) shows a symbolic equivalent circuit for the effective gate voltage (VGe) of a transistor. The voltage on the gate terminal (VG) couples to VGe through a gate capacitor (Cg), the voltage on the drain terminal (VD) couples to VGe through a drain capacitor (Cd), the voltage (VS) on the source terminal couples to VGe through a source capacitor (Cs), and the voltage (VB) on the substrate terminal couples to VGe through a substrate capacitor (Cb). Capacitors Cg, Cd, Cs, Cb are simplified equivalent circuits representing complex three dimensional effects. Ideally, Cg should be much larger than Cs, Cd, and Cb so that the effective gate voltage (VGe) equals the gate voltage (VG). In reality, Cd, Cb, and Cs can cause none-ideal effects on the operations of MOS transistors. The well-known example is the drain voltage induced leakage current caused by coupling voltage from VD through Cd. Relative to planar transistors, multiple-gate transistors effectively reduced Cd and Cs, which reduced the drain current induced leakage. By ignoring Cs and Cd, the equivalent circuit in FIG. 9(j) can be simplified into the simplified symbolic equivalent circuit in FIG. 9(k). From FIG. 9(k), the effective gate voltage VGe can be determined as $VGe=VG*[Cg/(Cg+Cb)]+VB*Cb/[(Cg+Cb)]$. The influence of VB on the effective gate voltage is called "body effect". When Cg is much larger than Cb, body effect is negligible. When Cb is not negligible comparing to Cg, reversed bias substrate voltage VB can reduce channel current. To turn off a transistor, body effect is desirable because it helps to reduce leakage current. To turn on a transistor, body effect is typically not desirable because it can reduce channel current. Cb is a function of doping profiles in the substrate, and a function of voltages. It is desirable to control the doping profile of a transistor so that Cb is much smaller than Cg when the transistor is turned on, and Cb is large enough to cause body effect when the transistor is turned off. For such ideal transistors, it is desirable to set substrate voltage in reverse bias because that helps in reducing leakage while the influence in speed is small.

When the substrate terminals of multiple gate transistors are connected to effective substrate connections, such as the examples shown in FIGS. 9(a, d, e), the substrate voltages can be controlled to help power savings. When the substrate terminals are floating, such as the examples shown in FIGS. 9(b, c, f-i), hybrid power saving modes still can be implemented by controlling the source and drain voltages without controlling substrate voltages.

This application is a continuation-in-part application of previous patent application with a Ser. No. 15/210,465, with a title "Low Power High Performance Electrical Circuits", and filed by the applicant of this invention on Jul. 3, 2016. The patent application discloses power saving mode related to memory decoders.

SUMMARY OF THE INVENTION

The primary objective of this invention is, therefore, to provide a power saving mode that is applicable on a circuit block that is still in use. The other objective of this invention is to provide additional power saving modes that can work in combination with prior art power saving modes to achieve optimum power saving. Another primary objective is to provide ultra-low power circuits that can switch rapidly from power saving mode to high speed operations for integrated circuits that use planar or multiple-gate MOS transistors. Another primary objective is to provide effective power saving modes for memory decoders.

These and other objectives are achieved by switching small parts of circuits to nominal-voltage when they need to operate at full speed, and switching them back to ultra-low power modes when they do not need to operate at full speed. The resulting circuits are capable of supporting ultra-low power operation without the disadvantages of conventional power manage units. A power saving mode that is especially useful to memory decoders is to set the drain-to-source voltage of every MOS transistor in a memory decoder to zero.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1(a) is a flowchart showing operations of a prior art power saving unit;

FIG. 1(b) is a flowchart showing operations of a prior art hybrid subthreshold (SubVt) circuit;

FIG. 3(h-k) are simplified schematic diagrams for exemplary memory decoders of the present invention;

FIG. 8(a) is a simplified cross-section diagram illustrating the structures of a planar MOS transistor;

FIG. 8(b) is a simplified diagram illustrating the three dimensional structures of a "FinFET";

FIG. 8(c) is a simplified cross-section diagram illustrating the gate structures of the FinFET in FIG. 8(b);

FIGS. 8(d-g) are simplified cross-section diagrams illustrating the gate structures of various examples of multiple-gate MOS transistors;

FIGS. 9(d-k) are simplified symbolic diagrams showing various components that can influence substrate voltages of multiple-gate MOS transistors.

DETAILED DESCRIPTION OF THE INVENTION

Figure 3A:
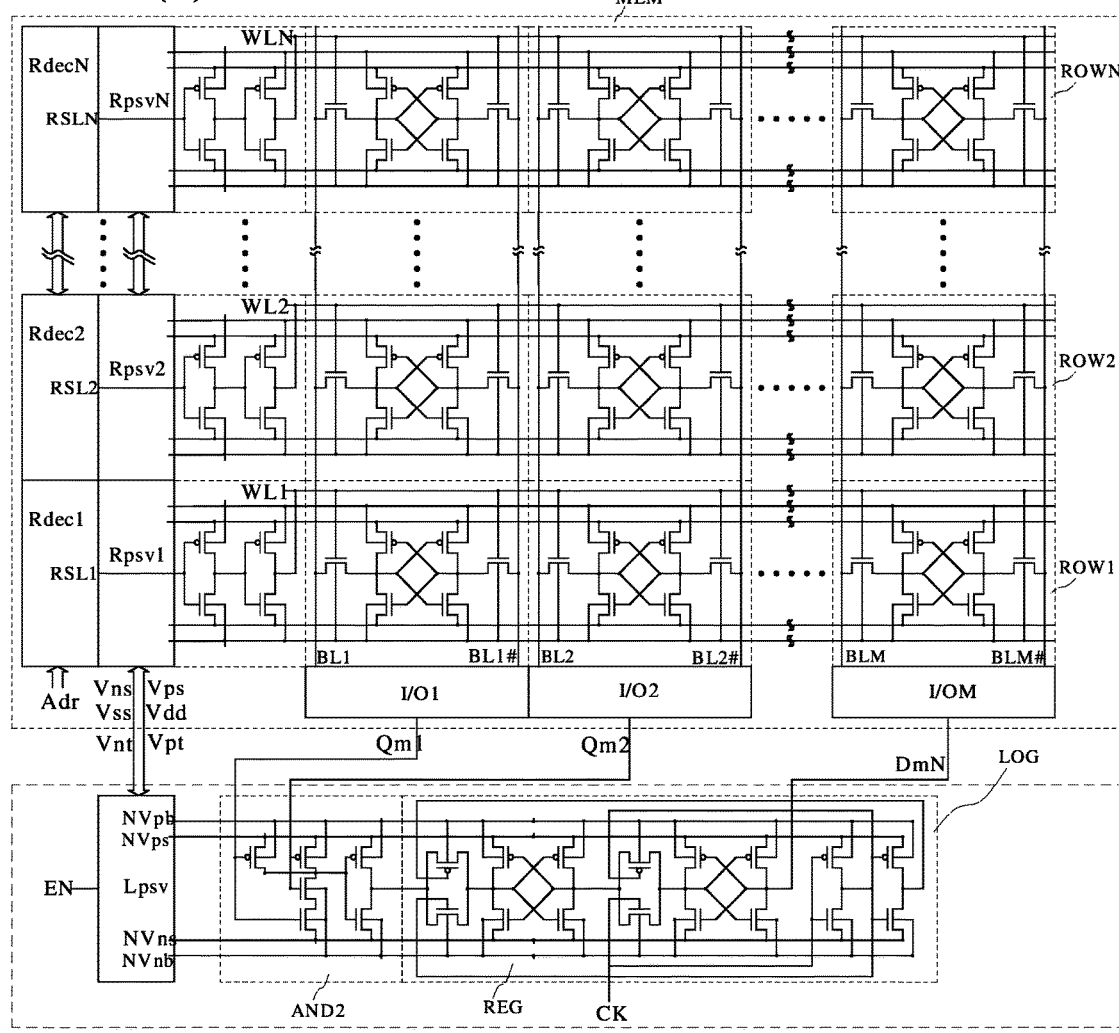
FIG. 3(a) is a simplified schematic diagram for one example of a CMOS circuit block that is capable of supporting power saving modes of the present invention.

FIG. 3(a) is a simplified schematic diagram for one example of a CMOS circuit block that is capable of supporting power saving modes of the present invention. This circuit comprises a memory module (MEM) and a logic module (LOG). In this example, the memory module (MEM) is an SRAM device that comprises a plurality of memory rows (ROW1, ROW2, . . . , ROWN), where N is an integer. Each memory row (ROW) of the SRAM comprises a plurality of memory cells (CL1, CL2, . . . , CLM), where M is an integer, as shown by the simplified schematic diagram in FIG. 3(b). The first memory cell (CL1) is connected to the first pair of bit lines (BL1, BL1#), the second memory cell (CL2) is connected to the second pair of bit lines (BL2, BL2#), . . . , and the M'th memory cell (CLM) is connected to the M'th pair of bit lines (BLM, BLM#). These bit line pairs (BL1, BL1#, BL2, BL2#, . . . , BLM, BLM#) are connected to the bit line pairs in other memory rows (ROW1, ROW2, . . . ROWN), and connected to input/output circuits (I/O1, I/O2, . . . , I/OM) of the SRAM module (MEM), as shown in FIG. 3(a).

Figure 2E:
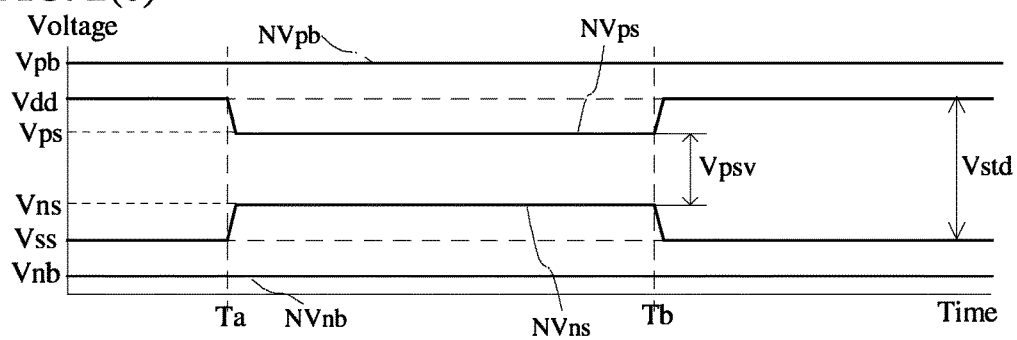
FIG. 2(a) shows the timing waveforms of a prior art power saving mode.
FIGS. 2(b-f) shows the timing waveforms of various hybrid circuit power saving mode operations.
Figure 3B:
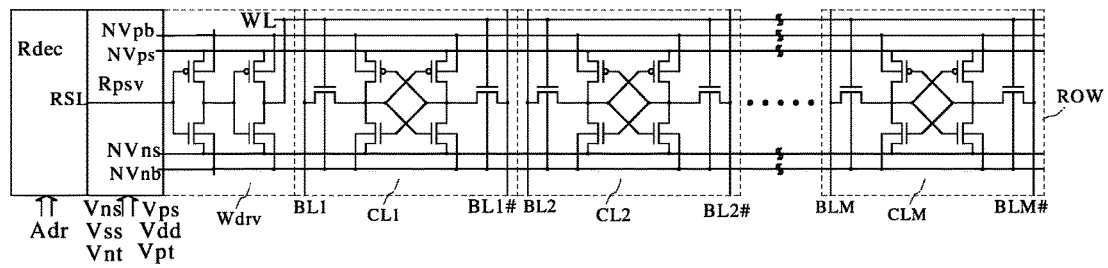
FIG. 3(b) is a simplified schematic diagram of one row of the SRAM device in FIG. 3(a)
Figure 3C:
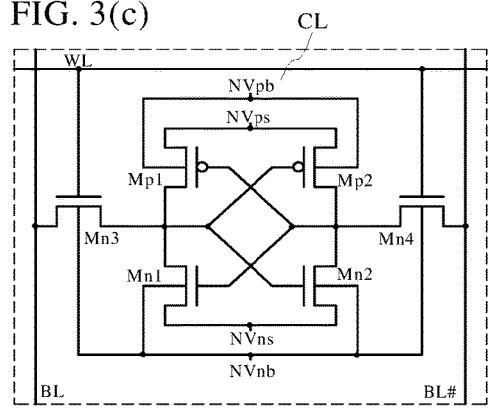
FIGS. 3(c-f) are schematic diagrams for the gates uses by the circuit in FIG. 3(a)
FIG. 3(g) is a simplified schematic diagram for a prior art AND gate used as the row decoder of the memory row in FIG. 3(b)
Figure 3D:
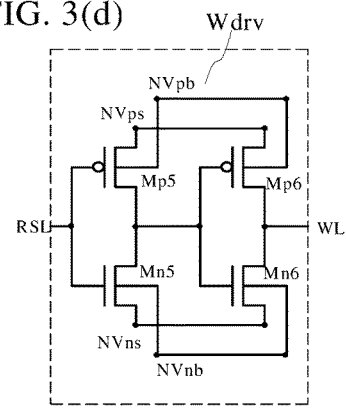

FIG. 3(c) is a schematic diagram showing the structures of one of the memory cell (CL) in FIG. 3(b). This memory cell (CL) comprises two p-channel MOS transistors (Mp1, Mp2) and four n-channel MOS transistors (Mn1-Mn4). The source terminals of Mp1 and Mp2 are connected together to a p-channel source connection (NVps), and the substrate terminals of Mp1 and Mp2 are connected together to a p-channel substrate connection (NVpb). The source terminals of Mn1 and Mn2 are connected together to an n-channel source connection (NVns), and the substrate terminals of Mn1 and Mn2 are connected together to an n-channel substrate connection (NVnb). The source terminal of Mn3 is connected to a bit line (BL), the source terminal of Mn4 is connected to another bit line (BL#), while the gates of Mn2 and Mn4 are connected to word line (WL), as shown in FIG. 3(c). All the memory cells (CL1, CL2, . . . , CLM) on the same memory row (ROW) are connected to the same word line (WL), which is driven by a word line driver (Wdrv), as shown in FIG. 3(b). FIG. 3(d) is a schematic diagram showing the structures of the word line driver (Wdrv) in FIG. 2(b). This word line driver (Wdrv) comprises two p-channel transistors (Mp5, Mp6) and two n-channel transistors (Mn5, Mn6). The source terminals of Mp5 and Mp6 are connected together to the p-channel source connection (NVps), and the substrate terminals of Mp5 and Mp6 are connected together to the p-channel substrate connection (NVpb). The source terminals of Mn5 and Mn6 are connected together to the n-channel source connection (NVns), and the substrate terminals of Mn5 and Mn6 are connected together to the n-channel substrate connection (NVnb). The drain terminals of Mp6 and Mn6 are connected to the word line (WL), while the gate terminals of Mp5 and Mn5 are connected to a row-select signal (RSL), as shown in FIG. 3(d) and in FIG. 3(b).

The p-channel source connection (NVps), p-channel substrate connection (NVpb), n-channel source connection (NVns), and n-channel substrate connection (NVnb) of the memory cells (CL1, CL2, . . . , CLM) are connected to those of the word line driver (Wdrv) of the same memory row (ROW). The voltages on NVps, NVpb, NVns, and NVnb are controlled by a power saving mode control circuit (Rpsv), as shown in FIG. 3(b). Depending on the address input signals (Adr), a row decoder (Rdec) turns on the row-select signal (RSL) when the memory cells (CL1, CL2, . . . , CLM) in the memory row (ROW) are needed to support read or write operations. This row-select signal (RSL) is used to turn on word line (WL) of the row, and it is also used by the power saving mode control circuit (Rpsv) to determine the voltage on NVps, NVpb, NVns, and NVnb. Each memory row (ROW1, ROW2, . . . , ROWN) of the SRAM array has its own row decoder (Rdec1, Rdec2, . . . , RdecN) that outputs a row-select signal (RSL1, RSL2, . . . , RSL3) to control a word line (WL1, WL2, . . . , WLN) and a power saving mode control circuit (Rpsv1, Rpsv2, . . . , RpsvN), as shown in FIG. 3(a).

Figure 3E:
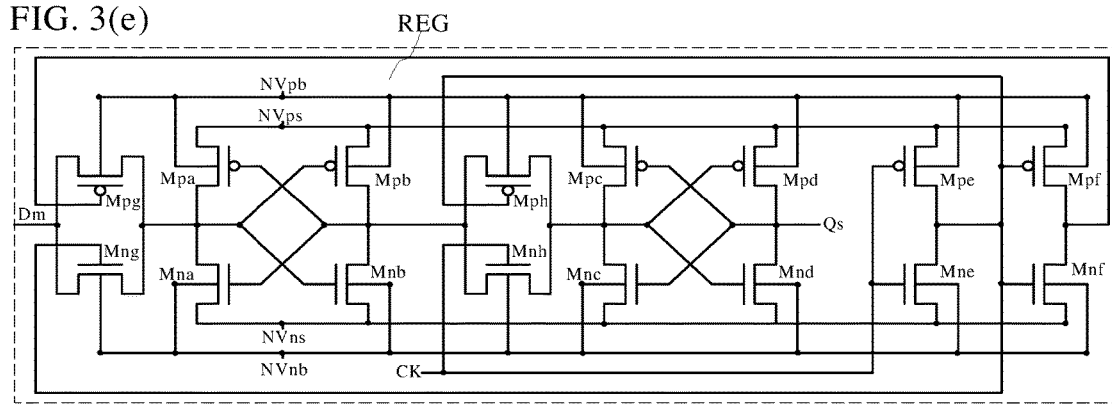

The logic module (LOG) in FIG. 3(a) comprises a register (REG), a two-input AND gate (AND2), and a power saving mode control circuit (Lpsv). FIG. 3(e) is a schematic diagram showing the structures of the register (REG) in the logic module (LOG). This register (REG) comprises 8 p-channel MOS transistors (Mpa-Mph) and 8 n-channel MOS transistors (Mna-Mnh). The source terminals of 6 p-channel MOS transistors (Mpa-Mpf) are connected together to a p-channel source connection (NVps), the substrate terminals of 8 p-channel MOS transistors (Mpa-Mph) are connected together to a p-channel substrate connection (NVpb), the source terminals of 6 n-channel MOS transistors (Mna-Mnf) are connected together to an n-channel source connection (NVns), and the substrate terminals of 8 n-channel MOS transistors (Mna-Mnh) are connected together to an n-channel substrate connection (NVnb), as shown in FIG. 3(e). The timing of this register (REG) is controlled by a clock signal (CK); the input of the register (Din) is connected to the source terminals of Mpg and Mng, while the output of the register (Qs) is connected to the source terminals of Mpd and Mnd, as shown in FIG. 3(e).

Figure 3F:
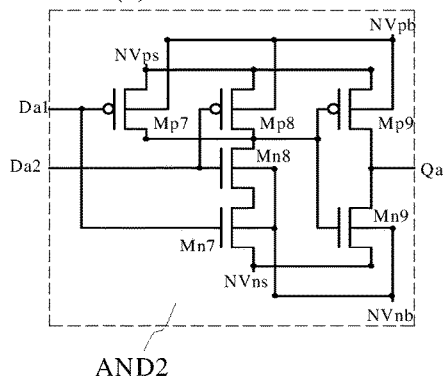

FIG. 3(f) is a schematic diagram showing the structures of the two-input AND gate (AND2) in the logic module (LOG). This logic gate comprises 3 p-channel MOS transistors (Mp7-Mp9) and 3 n-channel MOS transistors (Mn7-Mn9). The source terminals of those p-channel MOS transistors (Mp7-Mp9) are connected together to the p-channel source connection (NVps), the substrate terminals of those p-channel MOS transistors (Mp7-Mp9) are connected together to the p-channel substrate connection (NVpb), the source terminals of Mn7 and Mn9 are connected together to the n-channel source connection (NVns), and the substrate terminals of those n-channel MOS transistors (Mn7-Mn9) are connected together to the n-channel substrate connection (NVnb), as shown in FIG. 3(f). The inputs of this logic gate (AND2) are Da1 and Da2, while its output is Qa, as shown in FIG. 3(f). The p-channel source connection (NVps), p-channel substrate connection (NVpb), n-channel source connection (NVns), and n-channel substrate connection (NVnb) of the register (REG) are connected to those of the two-input AND gate (AND2) in the same logic module (LOG), and the voltages on NVps, NVpb, NVns, and NVnb are controlled by the power saving mode control circuit (Lpsv) that has an enable input signal (EN), as shown in FIG. 3(a). In this example, two of the SRAM data outputs (Qm1, Qm2) are connected to the inputs of the two-input AND gate (AND2), and the output of the register (REG) is connected to one of the data input (DmN) to the SRAM memory array (MEM), as shown in FIG. 3(a).

The circuit examples in FIGS. 3(a-f) can be implemented using planar MOS transistor or multiple-gate MOS transistors with effective substrate connections, such as the examples shown in FIGS. 9(a, d, e). For multiple-gate MOS transistors with floating substrate connections, such as the examples shown in FIGS. 9(b, c, f-i), the circuit examples in FIGS. 3(a-f) still can be implemented but the substrate terminals of transistors would be floating.

FIGS. 4(a, b) are simplified symbolic diagrams for one exemplary implementation of the power saving mode control circuit (Rpsv). This power saving mode control circuit comprises four switches (Wps, Wpd, Wnd, Wns) that are controlled by an enable signal (EN). For the example in FIG. 3(b), this enable signal (EN) is connected to the row-select signal (RSL) when it is used in the memory row (ROW). At normal operation mode, the first switch (Wps) connects NVpb to NVps, the second switch (Wpd) connects NVps to a power supply terminal at voltage Vdd, the third switch (Wnd) connects NVns to a ground terminal at voltage Vss, and the forth switch (Wns) connects NVnb to NVns, as shown in FIG. 4(a). Under this configuration, the power supply voltage (Vpower) equals (Vdd−Vss), which is typically set at standard voltage Vstd. At power saving mode, the first switch (Wps) connects NVpb to a voltage source at voltage Vpb, where Vpb>Vdd; the second switch (Wpd) connects NVps to a voltage source at voltage Vps, where Vps<Vdd; the third switch (Wnd) connects NVns to a voltage source at voltage Vns, where Vns>Vss; and the forth switch (Wns) connects NVnb to a voltage source at voltage Vnb, where Vnb<Vns, as shown in FIG. 4(b). The power supply voltage (Vpower) at this configuration equals (Vps−Vns). At super-threshold (SupVt) mode, Vpower is set at a voltage higher than the threshold voltage (Vt) of the n-channel MOS transistors in the CMOS circuit that is controlled by the power saving mode control circuit (Rpsv). Because Vpb>Vps and Vnb<Vns, the substrates of MOS transistors are reverse biased. Therefore, the standby leakage current of the circuit can be reduced significantly. Depending on the magnitude of the voltage differences (Vpb−Vps) and (Vns−Vnb), the standby leakage current under SupVt power saving mode can be reduced by 80%, by 95%, by 99%, or more, relative to the standby leakage current of the same electrical circuit under normal operation mode, where "normal operation mode" is defined as the operation condition when the voltage differences (Vpb−Vps) and (Vns−Vnb) are both set to zero, such as the condition shown in FIG. 4(a). The higher the reverse bias voltages, the more reduction in standby leakage current. Since Vpower>Vt under SupVt mode, the speed of the electrical circuit under SupVt mode is much faster relative to the speed of the same electrical circuit under SubVt mode. The speed of a circuit under SupVt mode is slower than that of the same circuit under normal operation mode, but it can be fast enough to support circuits that are not part of timing critical paths. A circuit designer can adjust the voltage differences (Vpb−Vps) and (Vns−Vnb) to meet both the speed requirement as well as the power requirements of a circuit block.

Figure 5A:
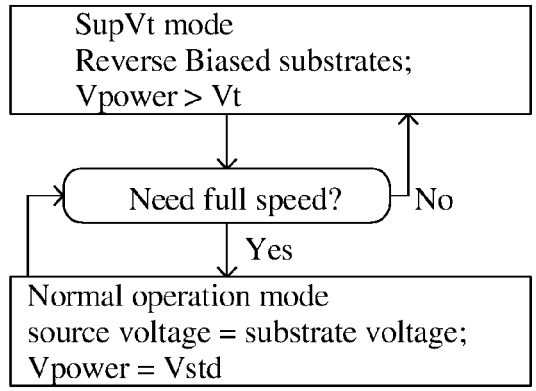
FIG. 5(a) is a flowchart showing operations of a Hybrid SupVt circuit supported by the control circuits in FIGS. 4(a, b)

FIG. 5(a) is a flowchart showing operations of a Hybrid SupVt circuit supported by the control circuits in FIGS. 4(a, b). The power saving mode control circuit check if the circuit block need to operate at full speed or not. If there is no need to operate at full speed, the circuit stay in SupVt power saving mode, where the substrates of MOS transistors are under reverse bias to reduce standby current, and Vpower is set at a level higher than the threshold voltage (Vt) of n-channel transistor. If the circuit needs to operate at full speed, the controller sets the circuit into normal operation mode, where substrates are not reverse biased, and power supply voltage (Vpower) equals standard voltage (Vstd). Typically, most of the circuit modules do not need to operate at full speed all the time. For example, the SRAM memory rows that are not selected do not need to operate at full speed. Even when an SRAM memory row is selected, it may not need to operate at full speed if the SRAM is not along timing critical paths. A logic module does not need to operate at full speed unless it is on a timing critical path that is under use. It is not unusual that more than 95% of modules can operate at SupVt mode. Hybrid SupVt circuits typically can achieve significant power saving without changing the overall performance of an integrated circuit.

FIG. 2(c) is a timing diagram showing voltage waveforms of hybrid SupVt circuits, where NVps is the p-channel source connection that connects source terminals of p-channel MOS transistors, NVpb is the p-channel substrate connection that connects substrate terminals of p-channel MOS transistors, NVns is the n-channel source connection that connects source terminals of n-channel MOS transistors, and NVnb is the n-channel substrate connection that connects substrate terminals of n-channel MOS transistors. In this example, the circuit starts in SupVt mode, where NVpb is at voltage Vpb, NVps is at voltage Vps, NVns is at voltage Vns, and NVnb is at voltage Vnb, as shown in FIG. 2(c). At time T5, the circuit needs to operate at full speed, so that the circuit is set into normal operation mode, where NVpb and NVps are connected together at voltage Vdd, NVns and NVnb are connected together at voltage Vss, and Vpower=Vstd, as shown in FIG. 2(c). At time T6, there is no need to operate at full speed, and the circuit is set back into SupVt mode, as shown in FIG. 2(c). Under SupVt mode, the standby leakage current of the circuit can be reduced by 80% or more, while all the memory devices still can hold their data. It is therefore possible to get into power saving mode immediately without the need to store the data in memory devices into nonvolatile memory devices. SubVt mode is applicable typically when the circuit does not need to work, while SupVt mode is applicable unless full speed is required. Although the standby leakage current under SupVt mode is typically higher than the standby current of the same electrical circuit under SubVt mode, the overall power saving achieved by SupVt mode can be better than that that of SubVt mode because there are more conditions when a circuit can stay in SupVt power saving mode.

While specific embodiments of the invention have been illustrated and described herein, it is realized that other modifications and changes will occur to those skilled in the art. The example in FIG. 3(a) shows a specific CMOS circuit block that comprises one SRAM array and one logic module, while SupVt mode is applicable to other types of CMOS circuits, such as memory devices, logic circuits, analog circuits, and other CMOS circuits. The logic module is FIG. 3(a) comprises three gates, while SupVt mode is applicable to much larger logic circuits. It is also typical to have circuit blocks in an integrated circuit so that part of the circuit blocks can stay in power saving mode while other circuit blocks can stay in normal operation mode. The voltage differences (Vpb−Vps) and (Vns−Vnb) do not have to be constant values under SupVt mode, those voltage differences can be adjustable voltages. Different circuit blocks may have different substrate bias voltages under SupVt modes. The example shown in FIGS. 5(a, b) switches between SupVt mode and normal operation mode, while hybrid SupVt circuits can switch between SupVt modes that have different substrate bias voltages depending on the speed requirement of the circuit block. A power saving mode control circuit can be part of an integrated circuit; it also can be an external circuit. FIGS. 4(a, b) show one specific implementation, while the power saving mode control circuit for hybrid SupVt circuits can be implemented in many other ways, such as the example shown in FIGS. 4(c, d).

FIGS. 4(c, d) are simplified symbolic diagrams for another implementation of the power saving mode control circuit for hybrid circuits. This power saving mode control circuit (Lpsv) comprises two switches (Wps, Wns) that are controlled by an enable signal (EN). At normal operation mode, Wps connects NVpb to NVps, and Wns connects NVnb to NVns, where NVps is always connected to power supply voltage Vdd, and NVns is always connected to ground voltage Vss, as shown in FIG. 4(c). Under this configuration, the power supply voltage (Vpower) equals (Vdd−Vss), which is typically set at standard voltage Vstd. At power saving mode, Wps connects NVpb to voltage Vpb, where Vpb>Vdd, and Wns connects NVnb to a voltage at Vnb, where Vnb<Vss, as shown in FIG. 4(d). The power supply voltage (Vpower) at this configuration stays at (Vdd−Vss)=Vstd, which is higher than the threshold voltage (Vt) of the n-channel MOS transistors in the CMOS circuit that is controlled by the power saving mode control circuit (Rpsv). Because Vpb>Vdd and Vnb<Vss, the substrates of MOS transistors are reverse biased. Therefore, the standby leakage current of the circuit can be reduced significantly. Depending on the magnitude of the voltage differences (Vpb−Vps) and (Vns−Vnb), the standby leakage current of a circuit under SupVt mode can be reduced by 80%, by 95%, by 99%, or more, relative to the standby leakage current of the same electrical circuit under normal operation mode. The higher the voltage differences (Vpb−Vps) and (Vns−Vnb), the more reduction in standby leakage current. The speed of a circuit under SupVt mode is slower than that of the same circuit under normal operation mode, but it can be fast enough to support many operations.

The power saving mode control circuits in FIGS. 4(a-d) can support hybrid circuits using planar MOS transistor or multiple-gate MOS transistors with effective substrate connections, such as the examples shown in FIGS. 9(a, d, e). For multiple-gate MOS transistors with floating substrate connections, such as the examples shown in FIGS. 9(b, c, f-i), the power saving mode control circuits in FIGS. 4(a-d) still can be implemented by controlling the source and drain voltages without controlling substrate voltages. The power saving mode control circuit is able to control the electrical circuit to operate in a power saving mode where the voltage differences (Vps−Vns) is set at a value that the volatile memory devices in the electrical circuit can hold their states, and that the standby leakage current flowing from the p-channel source connection to the n-channel source connection of the electrical circuit under power saving mode is reduced by at least 80% relative to the standby leakage current flowing from the p-channel source connection to the n-channel source connection of the same electrical circuit at normal operation mode, where "normal operation mode" is defined as the operation condition when the voltage differences (Vps−Vns) are set at standard operational voltage and when the substrate bias voltages of the n-channel MOS transistors and the substrate bias voltages of the p-channel MOS transistors are all set to zero.

Figure 5B:
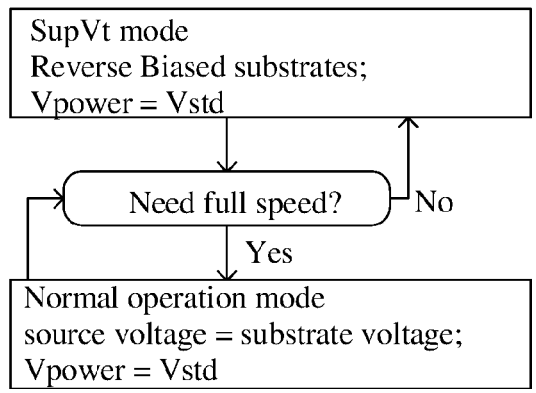
FIG. 5(b) is a flowchart showing operations of a Hybrid SupVt circuit supported by the control circuits in FIGS. 4(c, d)

FIG. 5(b) is a flowchart showing operations of a Hybrid SupVt circuit supported by the control circuits in FIGS. 4(c, d). The power saving mode control circuit check if the circuit block need to operate at full speed or not. If there is no need to operate at full speed, the circuit stay in SupVt power saving mode, where the substrates of MOS transistors are under reverse bias to reduce standby current, and Vpower is set at Vstd. If the circuit needs to operate at full speed, the controller sets the circuit into normal operation mode, where substrate voltages equal source voltages, and power supply voltage (Vpower) equals standard voltage (Vstd).

FIG. 2(d) is a timing diagram showing voltage waveforms of hybrid SupVt circuits. In this example, the circuit starts in SupVt mode, where NVpb is at voltage Vpb, NVps is at voltage Vdd, NVns is at voltage Vss, and NVnb is at voltage Vnb, as shown in FIG. 2(d). At time T7, the circuit needs to operate at full speed, so that the circuit is set into normal operation mode, where NVpb and NVps are connected together at voltage Vdd, NVns and NVnb are connected together at voltage Vss, and Vpower=Vstd, as shown in FIG. 2(d). At time T8, there is no need to operate at full speed, and the circuit is set back into SupVt mode, as shown in FIG. 2(d). Comparing to previous example, hybrid SupVt circuit supported by the controller in FIGS. 4(c, d) typically can operate at faster speed, while the standby leakage current of the circuit under SupVt mode can be reduced by 80% or more, relative to the standby leakage current of the same circuit under normal operations.

FIG. 2(e) is a timing diagram showing the voltage waveforms of a power saving mode especially useful for transistors that have small body effects when the transistors are turned on. Before time Ta, NVps is at voltage Vdd, NVns is at voltage Vss, NVpb is at voltage Vpb, and NVnb is at voltage Vnb, as shown in FIG. 2(e). Under this configuration, the substrates are reverse biased so that the leakage currents are smaller when transistors are turned off; the voltage difference Vdd−Vss equals standard voltage (Vstd) to support high speed operation; the operation speed can be as high as normal operation mode if the body effects of transistors are small when transistors are on. At time Ta, the circuit is switched into a power saving mode where NVps is at voltage Vps, NVns is at voltage Vns, NVpb stays at voltage Vpb, and NVnb stays at voltage Vnb, as shown in FIG. 2(e). The voltage differences (Vps-Vns) equals a power saving mode voltage Vpsv, which is high enough so that the volatile memory devices in the electrical circuit can hold their states, while Vpsv is low enough to reduce standby leakage current by more than 80%. At time Tb, the circuit switches back into high speed operation. Since all the memory devices hold their data, the speed to switch operation modes can be executed in less than 10 ns, 1 ns, or shorter time.

Figure 2F:
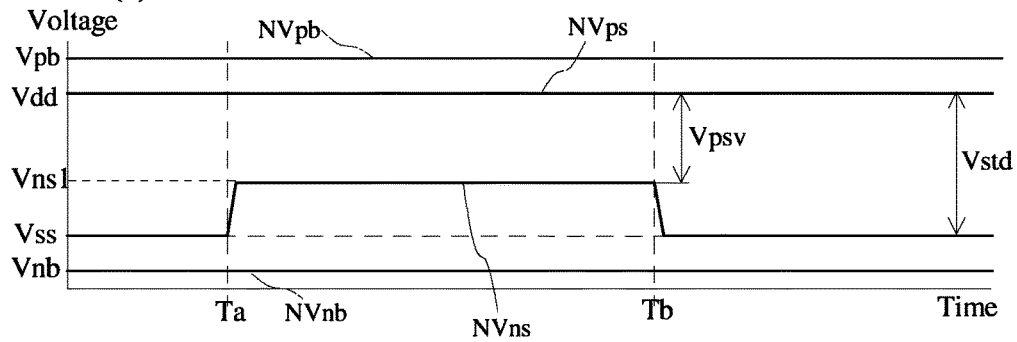

FIG. 2(f) is a timing diagram showing the voltage waveforms of a power saving mode especially useful for transistors that have small body effects when the transistors are turned on, and when the leakage currents of n-channel transistors are the dominating leakage source. Before time Ta, NVps is at voltage Vdd, NVns is at voltage Vss, NVpb is at voltage Vpb, and NVnb is at voltage Vnb, as shown in FIG. 2(e). Under this configuration, the substrates are reverse biased so that the leakage currents are smaller when transistors are turned off; the voltage difference Vdd−Vss equals standard voltage (Vstd) to support high speed operation; the operation speed can be as high as normal operation mode if the body effects of transistors are small when transistors are on. At time Ta, the circuit is switched into a power saving mode where NVps stays at voltage Vdd, NVns is at voltage Vns1, NVpb stays at voltage Vpb, and NVnb stays at voltage Vnb, as shown in FIG. 2(f). The voltage differences (Vdd-Vns1) equals a power saving mode voltage Vpsv, which is high enough so that the volatile memory devices in the electrical circuit can hold their states, while Vpsv is low enough to reduce standby leakage current by more than 80%. At time Tb, the circuit switches back into high speed operation. Since all the memory devices hold their data, the speed to switch operation modes can be executed in less than 10 ns, 1 ns, or shorter time.

The voltage waveforms in FIGS. 2(a-f) illustrate operations of hybrid circuits using planar MOS transistor or multiple-gate MOS transistors with effective substrate connections, such as the examples shown in FIGS. 9(a, d, e). For multiple-gate MOS transistors with floating substrate connections, such as the examples shown in FIGS. 9(b, c, f-i), the voltage waveforms of NVps and NVns are similar to those in FIGS. 2(a-f), but the voltage waveforms in the substrate terminals can be different.

Figure 5C:
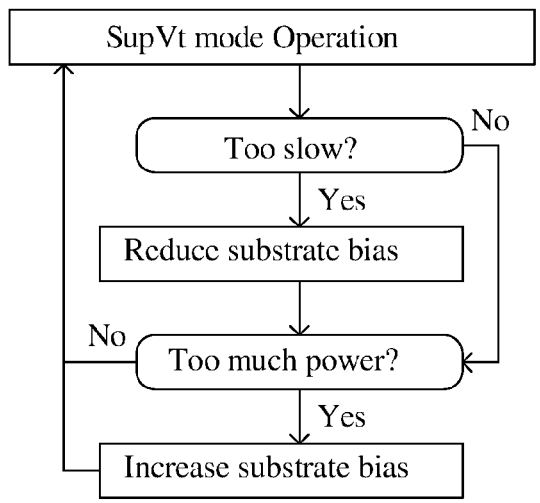
FIG. 5(c) is a flowchart showing operations of a Hybrid SupVt circuit with variable substrate bias voltages.

While specific embodiments of the invention have been illustrated and described herein, it is realized that other modifications and changes will occur to those skilled in the art. For example, the same circuit can have two or more hybrid SupVt modes at different speeds. FIG. 5(c) is a flowchart showing operations of a Hybrid SupVt circuit with variable substrate bias voltages. The controller or CAD tool check if the circuit block is too slow; if it is too slow, the amplitudes of substrate bias is reduced to meet speed requirement. The controller or CAD too also can check if the circuit block consumes too much power or not; if it consumes too much power, the amplitudes of substrate bias is increased to meet power requirement. These procedures can be repeated until all requirements are met.

Figure 6:
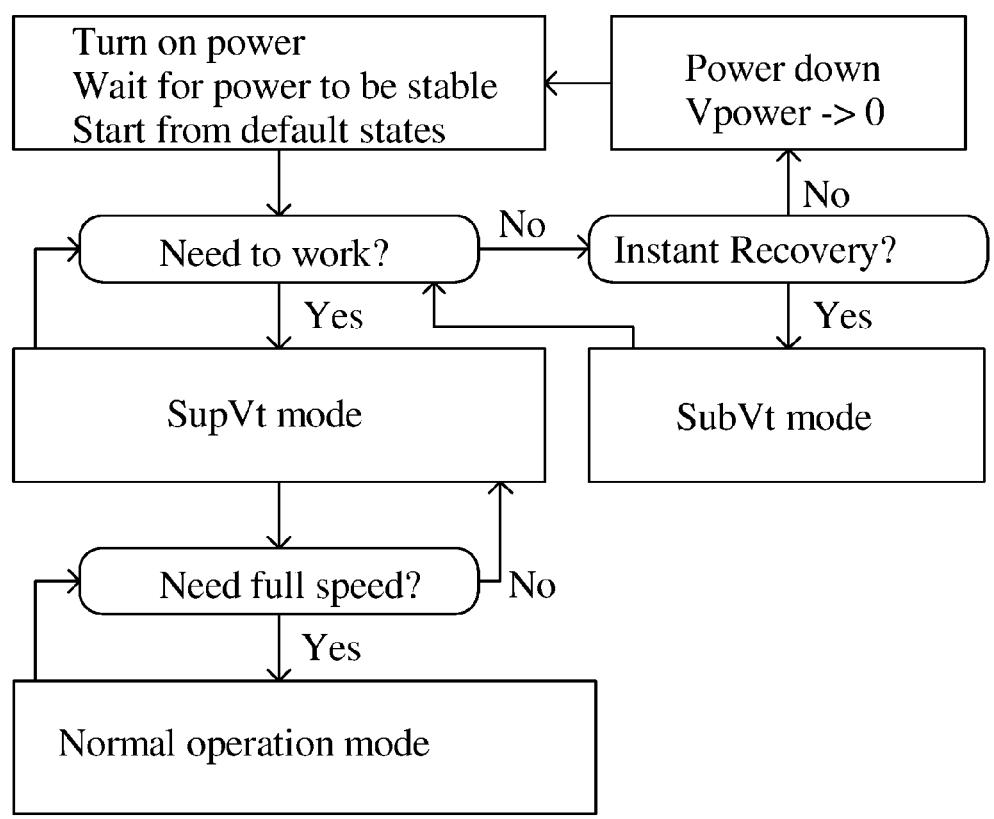
FIG. 6 is a flowchart showing operations of SupVt mode in combination of other types of power saving modes.

SupVt modes also can function in combination with other power saving modes, as illustrated by the example shown in FIG. 6. In this example, the circuit always start from a pre-defined default state after power up. Therefore, there is no need to restore data into memory devices. After power up, a controller checks if the circuit block is needed to work or not. If it needs to work, the circuit block is placed into SupVt mode, as shown in FIG. 6. In SupVt mode, if the circuit needs to work at full speed, it will move into normal operation mode. If the circuit needs to work but not at full speed, it will stay in SupVt mode. If the circuit no longer needs to work, the controller checks if instant recovery is needed or not. If instant recovery is needed, it moves into SubVt mode. If instant recovery is not needed, it can execute power shut down, as illustrated in FIG. 6. In these ways, optimum power saving can be achieved without sacrificing performance or recovery time.

Figure 7:
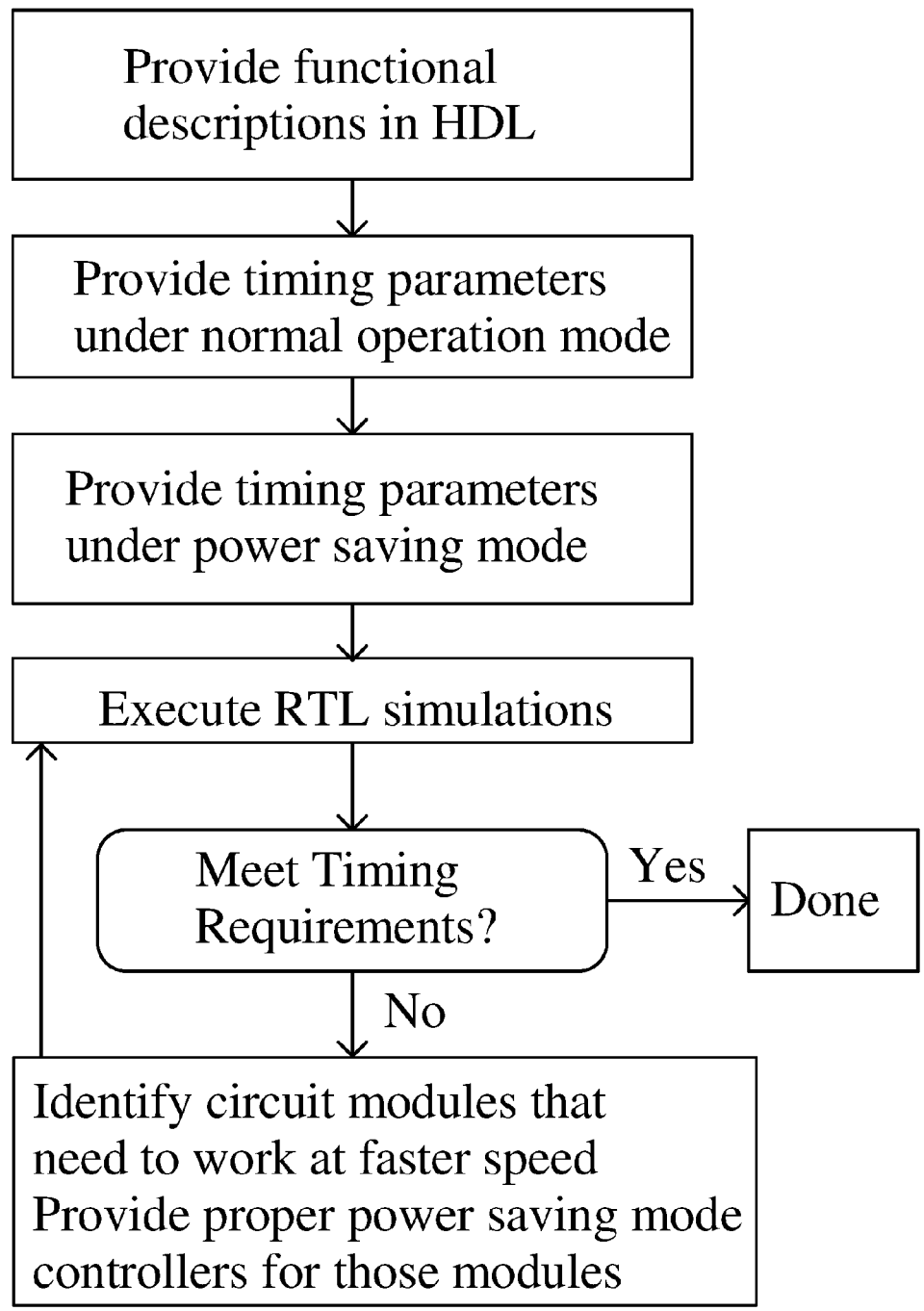
FIG. 7 is a flowchart showing an example of a Register-Transfer Level (RTL) Computer Aided Design (CAD) method that is capable of simulating hybrid SupVt circuits.
Figure 9A:
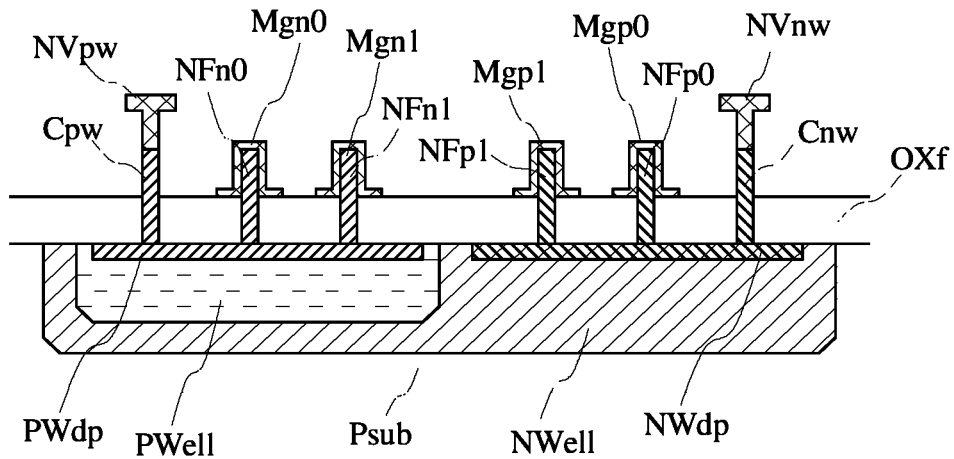
FIGS. 9(a-c) are simplified cross-section diagrams illustrating well connections and substrate connections of multiple-gate MOS transistors.
Figure 9B:
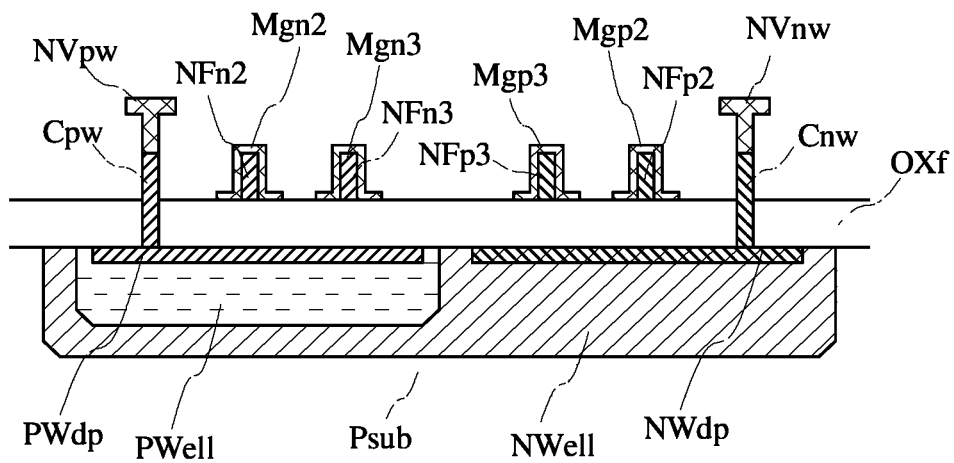
Figure 9C:
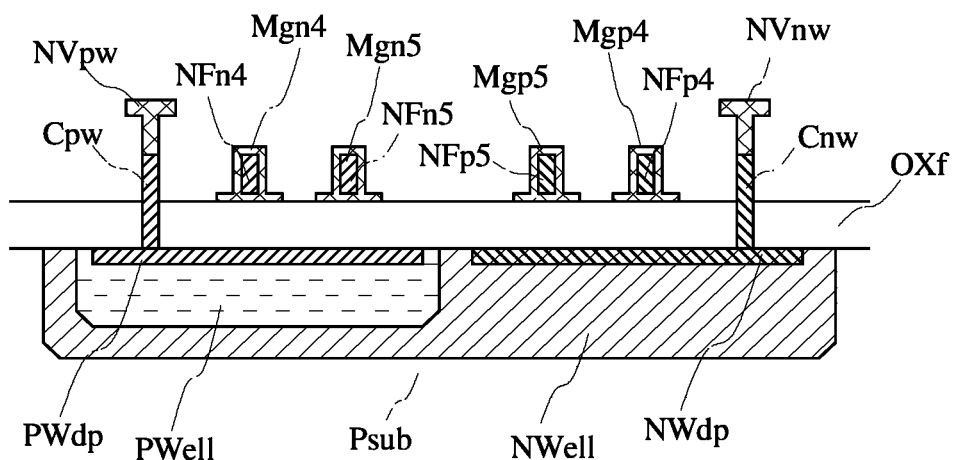
Figure 9D:
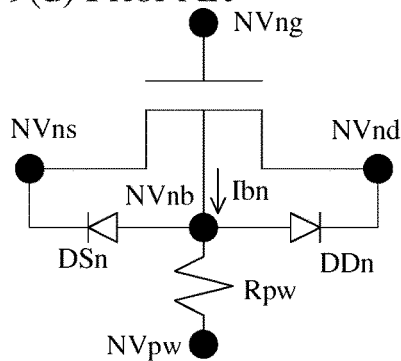
Figure 9E:
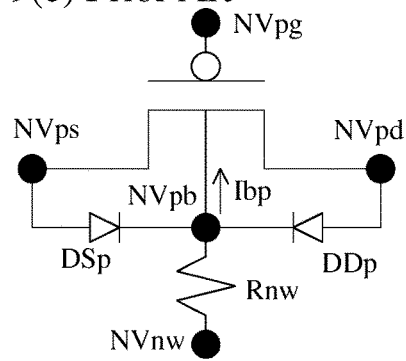
Figure 9F:
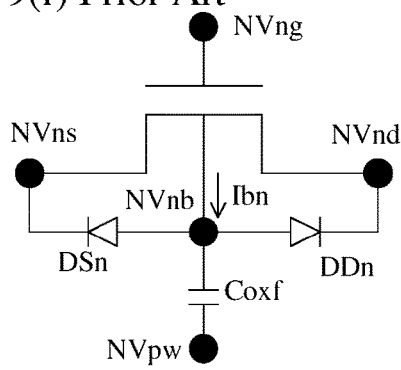
Figure 9G:
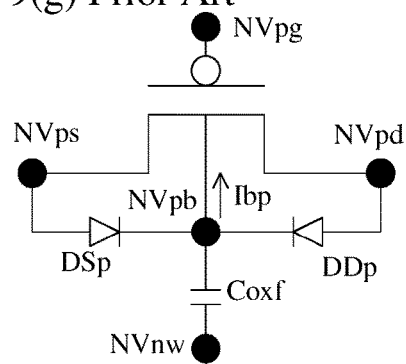
Figure 9H:
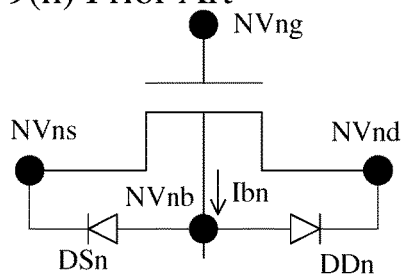
Figure 9I:
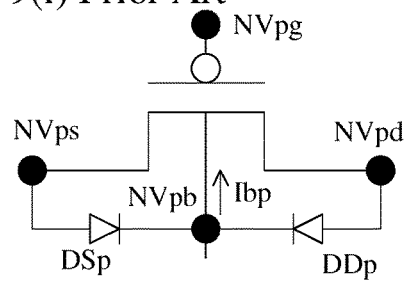
Figure 9J:
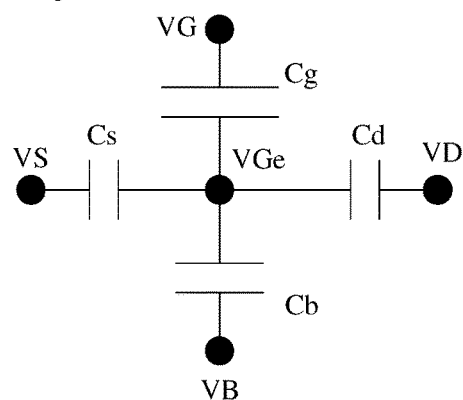
Figure 9K:
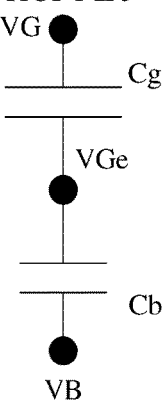

One critical step for designing Hybrid SupVt circuits is the procedure to determine the proper power saving mode for a circuit block. This procedure can be determined by logic circuits at real time. However, it is typically desirable to make the determination by computer aided design (CAD) software tools before an IC is manufactured. Using detailed simulation tools such as SPICE simulation, the timing of a circuit block can be determined accurately no matter it is working under normal operation mode or under SupVt mode. However, it is not practical to use SPICE on large integrated circuits that may have millions of gates or modules. In integrated circuit design, register-transfer level (RTL) is a design abstraction which models a circuit in terms of the flow of digital signals between hardware registers, and the logical operations performed on those signals. Register-transfer-level abstraction is used in hardware description languages (HDLs) like Verilog or VHDL to create high-level representations of a circuit, from which lower-level representations and ultimately actual physical circuits can be derived. Design at the RTL level is typical practice in modern circuit design. Besides function simulations, the timing of a circuit can be estimated by simulations or calculations at RTL level or higher abstract levels. Currently RTL simulations only use one set of timing parameters calibrated under normal operation mode. Current art RTL CAD tools are therefore not optimized to design hybrid circuits which comprises circuit blocks that may function in either normal operation mode or power saving mode. FIG. 7 is a flowchart showing an example of a Register-Transfer Level (RTL) Computer Aided Design (CAD) method that is capable of designing hybrid SupVt circuits. Besides providing functional descriptions in hardware description language (HDL), two or more sets of timing parameters are calibrated. Timing parameters such as delay time, rise time, fall time, setup time, hold time, and so on, of library cells are calibrated under normal operation mode as well as SupVt power saving mode. It is also desirable to calibrate the timing parameters under SubVt mode or another SupVt mode at different conditions. When RTL simulations are executed, the timing of each individual library cell is associated with the operation mode of the circuit block, so that the timing of the whole circuit can be estimated accurately. If the timing requirements are not met, the CAD tool can be used to identify circuit modules that need to work at faster speed in order to improve timing. The CAD tool can provide power saving mode controllers that can set those circuit modules to work at proper speed. RTL simulations are repeated under new conditions until timing requirements are met. In these ways, large scale hybrid SupVt circuits can be designed using design flows compatible with main stream IC design procedures.

While specific embodiments of the invention have been illustrated and described herein, it is realized that other modifications and changes will occur to those skilled in the art. A hybrid SupVt circuit is an electrical circuit comprising a plurality of p-channel Metal-Oxide-Semiconductor (MOS)

transistors, a p-channel source connection that connects the source terminals of those p-channel MOS transistors, a p-channel substrate connection that connects the substrate terminals of those p-channel MOS transistors, a plurality of n-channel MOS transistors, an n-channel source connection that connects the source terminals of those n-channel MOS transistors, an n-channel substrate connection that connects the substrate terminals of those n-channel MOS transistors, and a power saving mode control circuit that controls voltage differences (Vpb–Vps) and (Vns–Vnb), where the voltage difference (Vpb–Vps) is the voltage difference between the voltage (Vpb) on the p-channel substrate connection and the voltage (Vps) on the p-channel source connection, and the voltage difference (Vns–Vnb) is the voltage difference between the voltage (Vns) on the n-channel source connection and the voltage (Vnb) on the n-channel substrate connection; wherein the power saving mode control circuit is typically able to control the electrical circuit to operate in at least two operation modes: a normal operation mode where the voltage differences (Vpb–Vps) and (Vns–Vnb) are near zero, and a power saving mode where the voltage differences (Vpb–Vps) and (Vns–Vnb) are both set at positive values so that the standby leakage current flowing from the p-channel source connection to the n-channel source connection under the power saving mode is reduced by at least 80% relative to the standby leakage current flowing from the p-channel source connection to the n-channel source connection under normal operation mode. The voltage difference (Vps–Vns) under the SupVt power saving mode is higher than the threshold voltages of the n-channel MOS transistors. The power saving mode control circuit of the electrical circuit may or may not change the voltage difference (Vps–Vns) while changing from normal operation mode to power saving mode. The power saving mode control circuit can reduce the standby leakage current flowing from the p-channel source connection to the n-channel source connection by 80%, 95%, 99% or more, relative to the standby leakage current flowing from the p-channel source connection to the n-channel source connection of the same circuit at normal operation mode. The channel lengths of the MOS transistors in hybrid SupVt circuit can be shorter than 200 nanometers (nm) or shorter than 100 nm. Hybrid SupVt circuit can comprise logic gates that are placed and routed by automatic place and route computer aided design tool, static memory devices, Static Random Access Memory (SRAM) cells that are arranged by automatic memory compiler computer aided design tool, and wide varieties of other circuit modules. In order to support hybrid SupVt circuit design, it is desirable for a register-transfer level (RTL) computer aid design tool to provide at least two sets of timing parameters: one set of timing parameter representing the timing of the integrated circuit block under normal operation mode, and other sets of timing parameters representing the timing of the integrated circuit block under power saving mode operations, such as SupVt mode, SubVt mode operations, and/or other operation modes.

While specific embodiments of the invention have been illustrated and described herein, it is realized that other modifications and changes will occur to those skilled in the art. The above electrical circuits and methods can be implemented using planar MOS transistor as well as multiple-gate MOS transistors. A hybrid circuit can have a plurality of p-channel multiple-gate Metal-Oxide-Semiconductor (MOS) transistors, a p-channel source connection that connects the source terminals of those p-channel multiple-gate MOS transistors, a plurality of n-channel multiple-gate MOS transistors, an n-channel source connection that connects the source terminals of those n-channel multiple-gate MOS transistors, a volatile memory device that comprises part of said p-channel multiple-gate MOS transistors and part of said n-channel multiple-gate MOS transistors, and a power saving mode control circuit that controls voltage differences (Vps–Vns), where the voltage difference (Vps–Vns) is the voltage difference between the voltage (Vps) on the p-channel source connection, and the voltage (Vns) on the n-channel source connection; wherein the power saving mode control circuit is able to control the electrical circuit to operate in a power saving mode where the voltage differences (Vps–Vns) is set at a value that the volatile memory device can hold its state, and that the standby leakage current flowing from the p-channel source connection to the n-channel source connection of the electrical circuit under said power saving mode is reduced by at least 80% relative to the standby leakage current flowing from the p-channel source connection to the n-channel source connection of the same electrical circuit at normal operation mode, where "normal operation mode" is defined as the operation condition when the voltage differences (Vps–Vns) are set at standard operational voltage and when the substrate bias voltages of the n-channel multiple-gate transistors and the substrate bias voltages of the p-channel multiple-gate transistors are all set to zero. The power saving mode control circuit can reduce the standby leakage current flowing from the p-channel source connection to the n-channel source connection by 80%, 95%, 99% or more, relative to the standby leakage current flowing from the p-channel source connection to the n-channel source connection of the same circuit at normal operation mode. The channel lengths of the Multiple-gate MOS transistors in hybrid SupVt circuit can be shorter than 25 nanometers (nm) or shorter than 10 nm. Hybrid circuit with multiple-gate MOS transistors can comprise logic gates that are placed and routed by automatic place and route computer aided design tool, static memory devices, Static Random Access Memory (SRAM) cells that are arranged by automatic memory compiler computer aided design tool, and wide varieties of other circuit modules. In order to support hybrid circuit design, it is desirable for a register-transfer level (RTL) computer aid design tool to provide at least two sets of timing parameters: one set of timing parameter representing the timing of the integrated circuit block under normal operation mode, and other sets of timing parameters representing the timing of the integrated circuit block under power saving mode operations, and/or other operation modes.

Figure 3G:
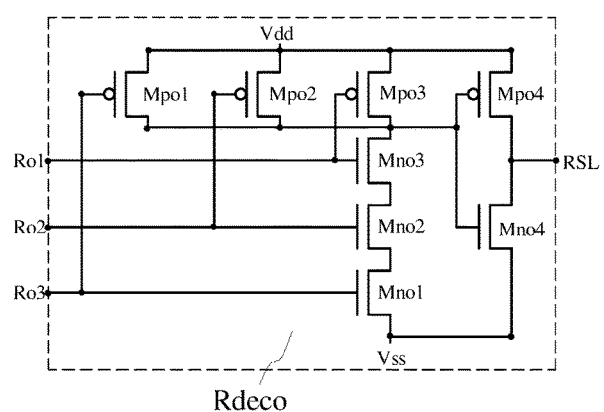

In FIG. 3(a), the semiconductor memory device (MEM) comprises a plurality of memory rows (ROW1, ROW2, . . . , ROWN). Each memory row comprises a plurality of memory cells (CL1, CL2, . . . , CLM) and one row decoder (Rdec), as illustrated in FIG. 3(b). FIG. 3(g) is a schematic diagram for one example of a prior art AND gate (Rdeco) that can be used as the row decoder (Rdec) for the memory row in FIG. 3(b). This prior art row decoder (Rdeco) comprises 4 p-channel MOS transistors (Mpo1-Mpo4), 4 n-channel MOS transistor (Mno1-Mno4), and three row-select binary input signals (Ro1-Ro3). A binary signal, by definition, is an electrical signal that has two logic states; it is either on or off. A row-select binary input signal can be high active or low active. A decoder, by definition, is an electrical circuit that turns on its output when all of its select input signals are turned on, and turns off its output when any one of its select input signals is off. For the example in FIG. 3(g), each row-select binary input signal (Ro1-Ro3) is turned on when its voltage is set to Vdd, and it is turned off when its voltage is set to Vss. When all row-select signals (Ro1-Ro3) are turned on, this row decoder (Rdeco) turns on the row-select output signal (RSL), and enable the memory cells (CL1, CL2, . . . , CLM) in the memory row to be available for memory read or memory write operations. When any one of the row-select binary input signals (Ro1-Ro3) is turned off, this row decoder (Rdeco) turns off the row-select signal (RSL). The row-select binary input signals (Ro1-Ro3) are typically pre-decoded signals so that most of time they are turned off. When all row-select signals (Ro1-Ro3) are turned off, the drain-to-source voltage differences on transistors Mpo1, Mpo2, Mpo3, and Mno4 are set to zero, but the drain-to-source voltage differences on transistors Mno1, Mno2, Mno3, and Mpo4 can be as high as (Vdd−Vss). Therefore, the prior art row decoder in FIG. 3(g) can have significant standby leakage current. It is therefore highly desirable to develop row decoders that have small standby leakage currents.

Figure 3H:
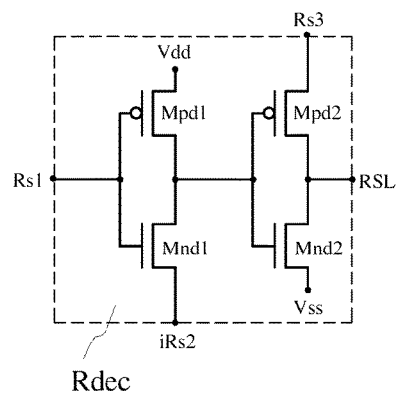

FIG. 3(h) is a schematic diagram for one example of a row decoder (Rdec) that can be used as the row decoder (Rdec) for the memory row in FIG. 3(b). This row decoder (Rdec) comprises 2 p-channel MOS transistors (Mpd1, Mpd2), 2 n-channel MOS transistors (Mnd1, Mnd2), and three row-select binary input signals (Rs1, iRs2, Rs2). For the example in FIG. 3(h), row-select binary input signal Rs1 is turned on when its voltage is set to Vdd, and it is turned off when its voltage is set to Vss; row-select binary input signal iRs2 is turned on when its voltage is set to Vss, and it is turned off when its voltage is set to Vdd; and row-select binary input signal Rs3 is turned on when its voltage is set to Vdd, and it is turned off when its voltage is set to Vss. When all row-select binary input signals (Rs1, iRs2, Rs2) are turned on, this row decoder (Rdec) turns on the row-select signal (RSL), and enable the memory cells (CL1, CL2, . . . , CLM) in the memory row to be available for memory read or memory write operations. When any one of the row-select signals (Rs1, iRs2, Rs3) is turned off with proper timing sequences, this row decoder (Rdec) turns off the row-select signal (RSL). Therefore, the row decoder in FIG. 3(h) can be functionally compatible with the prior art row decoder in FIG. 3(g). The difference is that this row decoder (Rdec) has a power saving mode that consume very small standby leakage current. When all row-select signals (Rs1, iRs2, Rs3) are turned off, the steady-state drain-to-source voltage difference of every MOS transistor (Mpd1, Mpd2, Mnd1, Mnd2) in the row decoder is set to zero, except for small voltage differences caused by none-ideal conditions. Therefore, when all row-select signals (Rs1, iRs2, Rs3) are turned off, the row decoder (Rdec) in FIG. 3(h) is placed in a power saving mode where the standby leakage current of the row decoder (Rdec) is very small.

While specific embodiments of the invention have been illustrated and described herein, it is realized that other modifications and changes will occur to those skilled in the art. The row decoder can have different number of MOS transistors arranged in different configurations. The row decoder can have different number of row-select binary input signals or output signals, while those signals can be high active or low active. The memory cells can be single port SRAM cells, multiple-port SRAM cells, or other types of memory cells. The MOS transistors in the memory cell or in the row decoder can be multiple-gate MOS transistor or planar MOS transistor. The channel length of those transistors can be shorter than 100 nanometers, 25 nanometers, or shorter. The memory device can be arranged by memory compiler computer aided tools, or arranged in other methods. To achieve better speed and better power saving, it is often desirable to divide a memory row into a plurality of sections.

Figure 3I:
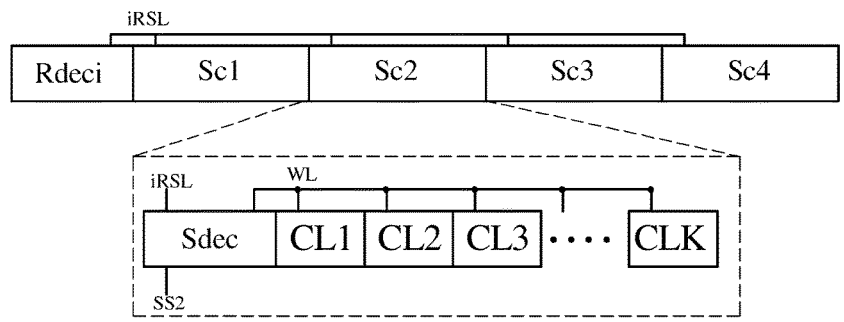
Figure 3J:
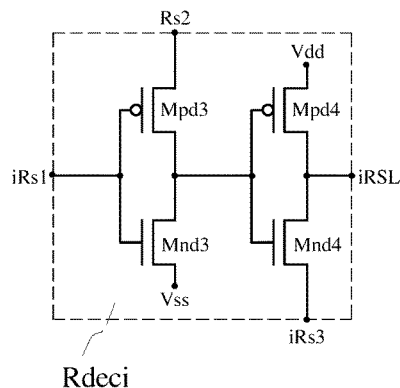

FIG. 3(i) is a simplified symbolic diagram showing a memory row that comprises a plurality of memory sections (Sc1-Sc4), where each memory section comprises a section decoder (Sdec) and a plurality of memory cells (CL1, CL2, CL3, . . . , CLK), where the section decoder (Sdec) comprises one or a plurality of MOS transistors and a plurality of section-select binary input signals. FIG. 3(j) is a schematic diagram for one example of the row decoder (Rdeci) for the memory row in FIG. 3(i). This row decoder (Rdeci) comprises a plurality of MOS transistors (Mpd3, Mpd4, Mnd3, Mnd4), and a plurality of row-select binary input signals (iRs1, Rs2, iRs3). For the example in FIG. 3(j), row-select binary input signal iRs1 is turned on when its voltage is set to Vss, and it is turned off when its voltage is set to Vdd; row-select binary input signal Rs2 is turned on when its voltage is set to Vdd, and it is turned off when its voltage is set to Vss; and row-select binary input signal iRs3 is turned on when its voltage is set to Vss, and it is turned off when its voltage is set to Vdd. When all row-select signals (iRs1, Rs2, iRs3) are turned on, this row decoder (Rdeci) turns on the row-select signal (iRSL), and enable the section decoders (Sdec) in the memory row so that part of the memory cells in the memory row can be available for memory read or memory write operations. For this example, the output signal (iRSL) is low active. When all row-select signals (iRs1, Rs2, iRs3) are turned off, the steady-state drain-to-source voltage difference of every MOS transistor (Mpd3, Mpd4, Mnd3, Mnd4) in the row decoder is set to zero, except for small voltage differences caused by none-ideal conditions.

Figure 3K:
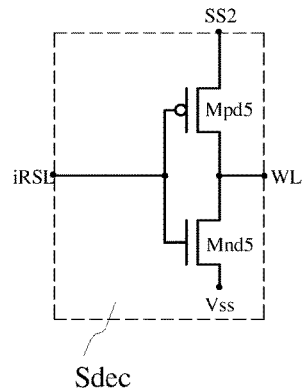
Figure 4A:
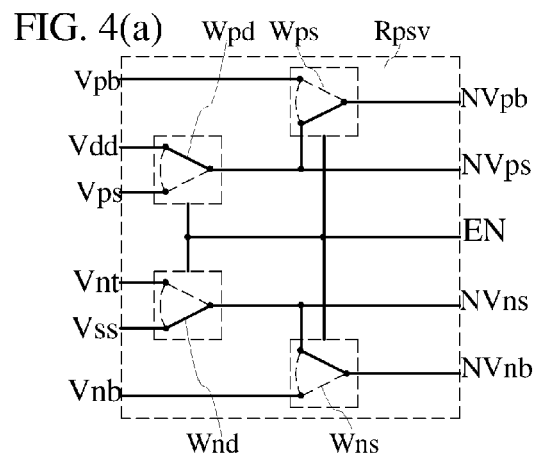
FIGS. 4(a-d) are simplified symbolic diagrams for the power saving mode control circuits uses by the circuit in FIG. 3(a)
Figure 4B:
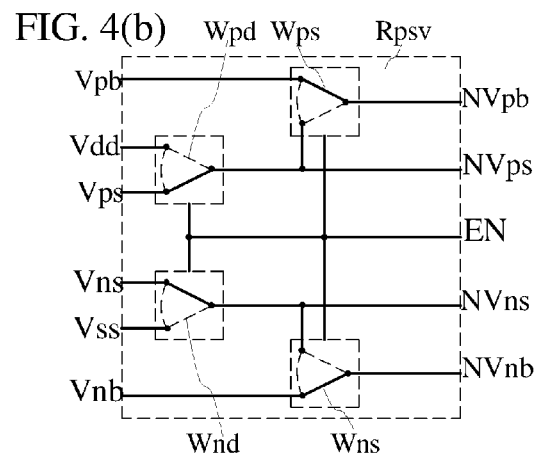
Figure 4C:
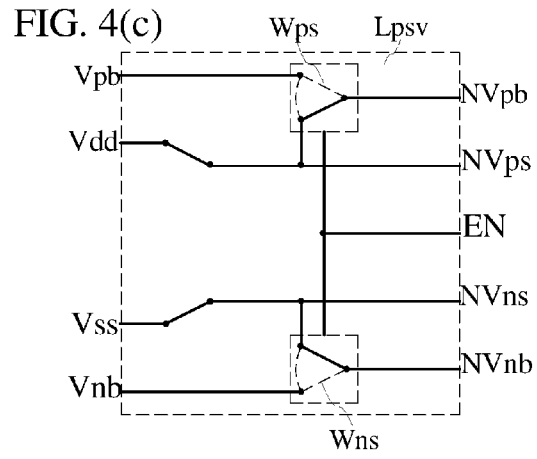
Figure 4D:
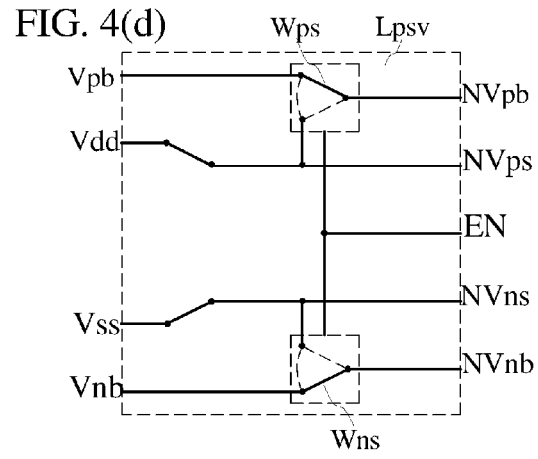

FIG. 3(k) is a schematic diagram for one example of the section decoder (Sdec) for the memory section (Sc2) in FIG. 3(i). This section decoder (Sdec) comprises two MOS transistors (Mpd5, Mnd5), and two section-select binary input signals (iRSL, SS2). It is typically desirable to use MOS transistors that are arranged in similar layout resembling the layout of the MOS transistor in nearby memory cells as part of or all of the MOS transistors used in a section decoder. It is also typically desirable to use MOS transistors that have the same electrical properties as the MOS transistor in nearby memory cells as part of or all of the MOS transistors used in a section decoder. For the example in FIG. 3(k), section-select binary input signal iRSL is turned on when its voltage is set to Vss, and it is turned off when its voltage is set to Vdd; and section-select binary input signal SS2 is turned on when its voltage is set to Vdd, and it is turned off when its voltage is set to Vss. When all section-select signals (iRSL, SS2) are turned on, this section decoder (Sdec) turns on a word line that is connected to all the memory cells (CL1, CL2, CL3, . . . , CLK) in the section so that those memory cells are available for memory read or memory write operations. When all the section-select binary input signals (iRSL, SS2) of the section decoder are turned off, the section decoder is placed into a power saving mode where the steady-state drain-to-source voltage difference of every MOS transistor (Mpd5, Mnd5) in the section decoder is set to zero, except for small voltage differences caused by none-ideal conditions.

While specific embodiments of the invention have been illustrated and described herein, it is realized that other modifications and changes will occur to those skilled in the art. The row decoder can have different number of MOS transistor arranged in different configurations. The section decoder (Sdec) in FIG. 3(k) comprises two MOS transistors while section decoders of the present invention can be implemented by one MOS transistor or many MOS transistors in various configurations. The section decoder can have different number of section-select binary input signals or output signals, while those signals can be high active or low active. The memory cells can be single port SRAM cells, multiple-port SRAM cells, or other types of memory cells. The MOS transistors in the memory cell or in the section decoder can be multiple-gate MOS transistors or planar MOS transistors. The channel length of those transistors can be shorter than 100 nanometers, 25 nanometers, or shorter. The memory device can be arranged by memory compiler computer aided tools, or arranged in other methods.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A semiconductor memory device that comprises a plurality of memory rows, where a said memory row comprises a plurality of memory cells and one row decoder, where a said row decoder comprises a plurality of MOS transistors and a plurality of row-select binary input signals, where the row decoder supports logic functions:
   when all the row-select binary input signals of the row decoder are turned on, the row decoder turns on its output signal to enable part of or all of the memory cells in the memory row to be available for memory read or memory write operations,
   when any one of the row-select binary input signals of the row decoder is turned off, the row decoder turns off its output signal, and
   when all the row-select binary input signals of the row decoder are turned off, the row decoder is placed into a power saving mode where the steady-state drain-to source voltage difference of every MOS transistor in the row decoder is set to zero, except for small voltage differences caused by none-ideal conditions.

2. The memory cells of the semiconductor memory device of claim 1 are Static Random Access Memory (SRAM) cells.

3. The memory cells of the semiconductor memory device of claim 2 are multiple-port SRAM cells.

4. The memory cells of the semiconductor memory device of claim 1 comprise multiple-gate MOS transistors.

5. The row decoder of the semiconductor memory device of claim 1 comprises multiple-gate MOS transistor.

6. The channel lengths of the MOS transistors of the row decoder of the semiconductor memory device in claim 1 are shorter than 100 nanometers.

7. The channel lengths of the MOS transistors of the row decoder of the semiconductor memory device in claim 1 are shorter than 25 nanometers.

8. The semiconductor memory device in claim 1 comprises memory rows that are arranged automatically by memory compiler computer aided design tool.

9. A semiconductor memory device that comprises a plurality of memory rows, where a said memory row further comprises a plurality of memory sections, where a said memory section comprises a section decoder and a plurality of memory cells, where a said section decoder comprises one or a plurality of MOS transistors and a plurality of section select binary input signals, where the section decoder supports logic functions:
   when all the section-select binary input signals of the section decoder are turned on, the section decoder turns on a word line that is connected to all the memory cells in the section so that those memory cells are available for memory read or memory write operations, and
   when all the section-select binary input signals of the section decoder are turned off, the section decoder is placed into a power saving mode where the steady-state drain-to-source voltage difference of every MOS transistor in the section decoder is set to zero, except for small voltage differences caused by none-ideal conditions.

10. The memory cells of the semiconductor memory device of claim 9 are Static Random Access Memory (SRAM) cells.

11. The memory cells of the semiconductor memory device of claim 10 are multiple-port SRAM cells.

12. The memory cells of the semiconductor memory device of claim 9 comprise multiple-gate MOS transistor.

13. The section decoder of the semiconductor memory device of claim 9 comprises multiple-gate MOS transistor.

14. One or a plurality of the MOS transistors in the section decoder of the memory device of claim 9 are arranged in similar layout resembling the layout of the MOS transistor in nearby memory cells.

15. One or a plurality of the MOS transistors in the section decoder of the memory device of claim 9 have the same electrical properties as the MOS transistor in nearby memory cells.

16. The channel lengths of the MOS transistors of the section decoder of the semiconductor memory device in claim 9 are shorter than 100 nanometers.

17. The channel lengths of the MOS transistors of the section decoder of the semiconductor memory device in claim 9 are shorter than 25 nanometers.

18. The semiconductor memory device in claim 9 comprises memory sections that are arranged automatically by memory compiler computer aided design tool.

19. A method for designing a semiconductor memory device comprises the steps of:
   arranging the memory cells in the semiconductor memory devices into a plurality of memory rows;
   providing a row decoder for each memory row, where said row decoder comprises a plurality of MOS transistors and a plurality of row-select binary input signals, where the row decoder supports logic functions:
   when all the row-select binary input signals of the row decoder are turned on, the row decoder turns on a word line that is connected to all the memory cells in the memory row so that those memory cells are available for memory read or memory write operations, and
   when all the row-select binary input signals of the row decoder are turned off, the row decoder is placed into a power saving mode where the steady-state drain-to-source voltage difference of every MOS transistor in the row decoder is set to zero, except for small voltage differences caused by none-ideal conditions.

20. The method for building a semiconductor memory device in claim 19 further comprises the steps of:
   dividing the memory row in the semiconductor memory devices into a plurality of memory sections;
   providing a section decoder for each memory section, where said section decoder comprises one or a plurality of MOS transistors and a plurality of section-select binary input signals; where the section decoder supports logic functions:

when all the section-select binary input signals of the section decoder are turned on, the section decoder turns on a word line that is connected to all the memory cells in the section so that those memory cells are available for memory read or memory write operations, and
when all the section-select binary input signals of the section decoder are turned off, the section decoder is placed into a power saving mode where the steady-state drain-to-source voltage difference of every MOS transistor in the section decoder is set to zero, except for small voltage differences caused by none-ideal conditions.

* * * * *